US008526472B2

(12) United States Patent  
Flanders et al.

(10) Patent No.: US 8,526,472 B2  
(45) Date of Patent: Sep. 3, 2013

(54) ASE SWEPT SOURCE WITH SELF-TRACKING FILTER FOR OCT MEDICAL IMAGING

(75) Inventors: Dale C. Flanders, Lexington, MA (US); Walid A. Atia, Lexington, MA (US); Mark E. Kuznetsov, Lexington, MA (US)

(73) Assignee: Axsun Technologies, Inc., Billerica, MA (US)

( * ) Notice: Subject to any disclaimer, the term of this patent is extended or adjusted under 35 U.S.C. 154(b) by 364 days.

(21) Appl. No.: 12/776,373

(22) Filed: May 8, 2010

(65) Prior Publication Data

US 2011/0051143 A1 Mar. 3, 2011

Related U.S. Application Data

(63) Continuation-in-part of application No. 12/553,295, filed on Sep. 3, 2009.

(51) Int. Cl.  
*H01S 3/10* (2006.01)  
*H01S 3/13* (2006.01)

(52) U.S. Cl.  
USPC .................. 372/20; 372/24; 372/32

(58) Field of Classification Search  
None  
See application file for complete search history.

(56) References Cited

U.S. PATENT DOCUMENTS

| | | |
|---|---|---|
| 3,914,055 A | 10/1975 | Wolga et al. |
| 4,466,699 A | 8/1984 | Droessler et al. |
| 4,929,063 A | 5/1990 | Durand et al. |
| 4,989,216 A * | 1/1991 | Chandra et al. .................. 372/97 |
| 5,263,037 A | 11/1993 | Trutna, Jr. et al. |
| 5,321,501 A | 6/1994 | Swanson et al. |
| 5,430,574 A | 7/1995 | Tehrani |
| 5,434,943 A | 7/1995 | Dentai et al. |
| 5,459,570 A | 10/1995 | Swanson et al. |
| 5,465,147 A | 11/1995 | Swanson |
| 5,475,221 A | 12/1995 | Wang |

(Continued)

FOREIGN PATENT DOCUMENTS

| | | |
|---|---|---|
| DE | 4122925 A1 | 1/1993 |
| DE | 10 2008 045 634 A1 | 3/2010 |

(Continued)

OTHER PUBLICATIONS

Aljada, M. et al., "Experimental demonstration of a tunable laser using an SOA and an Opto-VLSI Processor," Optics Express, vol. 15, No. 15, Jul. 23, 2007, pp. 9666-9671.

(Continued)

*Primary Examiner* — Armando Rodriguez  
*Assistant Examiner* — Sean Hagan  
(74) *Attorney, Agent, or Firm* — Houston & Associates, LLP

(57) ABSTRACT

An integrated swept wavelength tunable optical source uses a narrowband filtered broadband signal with an optical amplifier and self-tracking filter. This source comprises a micro optical bench, a source for generating broadband light, a tunable Fabry Perot filter, installed on the bench, for spectrally filtering the broadband light from the broadband source to generate a narrowband tunable signal, an amplifier, installed on the bench, for amplifying the tunable signal. The self-tracking arrangement is used where a single tunable filter both generates the narrowband signal and spectrally filters the amplified signal. In some examples, two-stage amplification is provided. The use of a single bench implementation yields a low cost high performance system. For example, polarization control between components is no longer necessary.

23 Claims, 17 Drawing Sheets

(56) References Cited

U.S. PATENT DOCUMENTS

| | | | |
|---|---|---|---|
| 5,500,762 A | 3/1996 | Uchiyama et al. | |
| 5,509,093 A | 4/1996 | Miller et al. | |
| 5,537,634 A | 7/1996 | Fye | |
| 5,574,739 A | 11/1996 | Carruthers et al. | |
| 5,600,466 A | 2/1997 | Tsushima et al. | |
| 5,619,368 A | 4/1997 | Swanson | |
| 5,627,668 A | 5/1997 | Fye | |
| 5,646,729 A | 7/1997 | Koskinen et al. | |
| 5,724,373 A * | 3/1998 | Chang | 372/20 |
| 5,742,418 A | 4/1998 | Mizutani et al. | |
| 5,748,598 A | 5/1998 | Swanson et al. | |
| 5,784,352 A | 7/1998 | Swanson et al. | |
| 5,808,788 A | 9/1998 | Park et al. | |
| 5,818,586 A | 10/1998 | Lehto et al. | |
| 5,956,355 A | 9/1999 | Swanson et al. | |
| 5,991,477 A | 11/1999 | Ishikawa et al. | |
| 6,111,645 A | 8/2000 | Tearney et al. | |
| 6,134,003 A | 10/2000 | Tearney et al. | |
| 6,160,826 A | 12/2000 | Swanson et al. | |
| 6,191,862 B1 | 2/2001 | Swanson et al. | |
| 6,204,920 B1 | 3/2001 | Ellerbrock et al. | |
| 6,282,011 B1 | 8/2001 | Tearney et al. | |
| 6,282,215 B1 | 8/2001 | Zorabedian et al. | |
| 6,339,603 B1 | 1/2002 | Flanders et al. | |
| 6,345,059 B1 | 2/2002 | Flanders | |
| 6,357,913 B1 | 3/2002 | Kim et al. | |
| 6,359,724 B1 | 3/2002 | Katagiri et al. | |
| 6,373,632 B1 | 4/2002 | Flanders | |
| 6,377,386 B1 | 4/2002 | Korn | |
| 6,381,022 B1 | 4/2002 | Zavracky | |
| 6,407,376 B1 | 6/2002 | Korn et al. | |
| 6,421,164 B2 | 7/2002 | Tearney et al. | |
| 6,445,939 B1 | 9/2002 | Swanson et al. | |
| 6,473,234 B2 | 10/2002 | Kuznetsov | |
| 6,485,413 B1 | 11/2002 | Boppart et al. | |
| 6,490,074 B1 | 12/2002 | Korn | |
| 6,501,551 B1 | 12/2002 | Tearney et al. | |
| 6,510,261 B2 | 1/2003 | Sorin et al. | |
| 6,552,796 B2 | 4/2003 | Magnin et al. | |
| 6,564,087 B1 | 5/2003 | Pitris et al. | |
| 6,570,659 B2 | 5/2003 | Schmitt | |
| 6,608,711 B2 | 8/2003 | Flanders et al. | |
| 6,619,864 B2 | 9/2003 | Johnson et al. | |
| 6,639,666 B2 | 10/2003 | Li | |
| 6,706,004 B2 | 3/2004 | Tearney et al. | |
| 6,816,515 B1 | 11/2004 | Yun et al. | |
| 6,845,121 B2 | 1/2005 | McDonald | |
| 6,853,654 B2 | 2/2005 | McDonald et al. | |
| 6,862,136 B2 | 3/2005 | Koren et al. | |
| 6,879,619 B1 | 4/2005 | Green et al. | |
| 6,879,851 B2 | 4/2005 | McNamara et al. | |
| 6,888,856 B2 | 5/2005 | Green et al. | |
| 6,891,984 B2 | 5/2005 | Petersen et al. | |
| 6,901,087 B1 | 5/2005 | Richardson et al. | |
| 6,905,255 B2 | 6/2005 | Flanders et al. | |
| 6,999,491 B2 * | 2/2006 | Rieger et al. | 372/75 |
| 7,027,198 B2 | 4/2006 | Yao | |
| 7,061,618 B2 * | 6/2006 | Atia et al. | 356/454 |
| 7,075,058 B2 | 7/2006 | Chinn et al. | |
| 7,110,169 B1 | 9/2006 | Walker et al. | |
| 7,120,176 B2 | 10/2006 | McDonald et al. | |
| 7,157,712 B2 | 1/2007 | Flanders et al. | |
| 7,208,333 B2 | 4/2007 | Flanders et al. | |
| 7,218,436 B2 | 5/2007 | Yao | |
| 7,231,243 B2 | 6/2007 | Tearney et al. | |
| 7,241,286 B2 | 7/2007 | Atlas | |
| 7,242,509 B2 | 7/2007 | Atia et al. | |
| 7,292,344 B2 | 11/2007 | Atia et al. | |
| 7,349,631 B2 | 3/2008 | Lee et al. | |
| 7,391,520 B2 | 6/2008 | Zhou et al. | |
| 7,406,107 B2 | 7/2008 | Flanders et al. | |
| 7,414,779 B2 | 8/2008 | Huber et al. | |
| 7,415,049 B2 | 8/2008 | Flanders et al. | |
| 7,613,398 B2 | 11/2009 | Lee et al. | |
| 7,625,366 B2 | 12/2009 | Atlas | |
| 7,813,609 B2 | 10/2010 | Petersen et al. | |
| 7,848,791 B2 | 12/2010 | Schmitt et al. | |
| 7,884,945 B2 | 2/2011 | Srinivasan et al. | |
| 7,903,979 B2 | 3/2011 | Lee et al. | |
| 7,916,387 B2 | 3/2011 | Schmitt | |
| 7,935,060 B2 | 5/2011 | Schmitt et al. | |
| 2001/0013934 A1 * | 8/2001 | Varnham et al. | 356/478 |
| 2002/0054614 A1 | 5/2002 | Jin | |
| 2002/0161351 A1 | 10/2002 | Samson et al. | |
| 2003/0107745 A1 | 6/2003 | Atia et al. | |
| 2003/0179790 A1 | 9/2003 | Bouda et al. | |
| 2005/0078716 A1 | 4/2005 | Liu | |
| 2005/0083533 A1 | 4/2005 | Atia et al. | |
| 2005/0201662 A1 | 9/2005 | Petersen et al. | |
| 2005/0265402 A1 | 12/2005 | Tanaka et al. | |
| 2006/0072112 A1 | 4/2006 | Flanders et al. | |
| 2006/0072632 A1 | 4/2006 | Flanders et al. | |
| 2006/0095065 A1 | 5/2006 | Tanimura et al. | |
| 2006/0109872 A1 | 5/2006 | Sanders | |
| 2006/0187537 A1 | 8/2006 | Huber et al. | |
| 2007/0013917 A1 | 1/2007 | Stubbe et al. | |
| 2008/0165366 A1 | 7/2008 | Schmitt | |
| 2009/0174931 A1 | 7/2009 | Huber et al. | |
| 2009/0245304 A1 | 10/2009 | Peng et al. | |
| 2009/0306520 A1 | 12/2009 | Schmitt et al. | |
| 2009/0323080 A1 | 12/2009 | Toida | |
| 2010/0076320 A1 | 3/2010 | Petersen et al. | |
| 2010/0094127 A1 | 4/2010 | Xu | |
| 2010/0103964 A1 | 4/2010 | Huber | |
| 2010/0128348 A1 | 5/2010 | Taverner | |
| 2010/0253949 A1 | 10/2010 | Adler et al. | |
| 2011/0007315 A1 | 1/2011 | Petersen et al. | |
| 2011/0051143 A1 | 3/2011 | Flanders et al. | |
| 2011/0071404 A1 | 3/2011 | Schmitt et al. | |
| 2011/0101207 A1 | 5/2011 | Schmitt | |
| 2011/0157686 A1 | 6/2011 | Huber et al. | |

FOREIGN PATENT DOCUMENTS

| | | |
|---|---|---|
| EP | 0 501 559 A1 | 9/1992 |
| EP | 0524382 B1 | 1/1993 |
| EP | 0709659 A2 | 5/1996 |
| EP | 0469259 B1 | 8/1996 |
| EP | 0911655 A2 | 4/1999 |
| EP | 1 744 119 A1 | 1/2007 |
| EP | 1020969 B1 | 3/2007 |
| FR | 2704651 A1 | 11/1994 |
| GB | 2118768 A | 11/1983 |
| GB | 2317045 A | 3/1998 |
| JP | 63092917 A | 4/1988 |
| JP | 8148744 A | 6/1996 |
| WO | 0165734 A2 | 9/2001 |
| WO | 03/046630 A1 | 6/2003 |
| WO | 03096106 A1 | 11/2003 |
| WO | 2006/039091 A2 | 4/2006 |
| WO | 2006/039154 A1 | 4/2006 |
| WO | 2008/135034 A1 | 11/2008 |
| WO | 2010/026197 A2 | 3/2010 |

OTHER PUBLICATIONS

Chang, T. et al., "Pulsed Dye-Laser with Grating and Etalon in a Symmetric Arrangement," Appl. Opt., vol. 19, No. 21, 1980, pp. 3651-3654.

Coquin, G. et al., "Single- and multiple-wavelength operation of acoustooptically tuned semiconductor lasers at 1.3 μm," IEEE Journal of Quantum Electronics, vol. 25, No. 6, Jun. 1989, pp. 1575-1579.

Huber, R. et al., "Fourier Domain Mode Locked Lasers for OCT imaging at up to 290 kHz sweep rates," Proceedings of the SPIE, OSA Biomedical Optics, vol. 5861, 2005, pp. 58611B-1 to 58611B-6.

Klauminzer, GK, "Etalon-Grating Synchronized Scanning of a Narrowband Pulsed Dye Laser," Optical Engineering, vol. 13, No. 6, 1974; pp. 528-530.

Kowalski, F.V. et al., "Optical pulse generation with a frequency shifted feedback laser," Applied Physics Letters, vol. 53, No. 9, Aug. 1988, pp. 734-736.

Oshiba, S. et al., "Tunable fiber ring lasers with an electronically accessible acousto-optic filer," Photonic Switching II, Proceedings of the International Topical Meeting, Kobe, Japan, Apr. 1990, pp. 241-244.

Shimizu, K. et al., "Measurement of Rayleigh Backscattering in Single-Mode Fibers Based on Coherent OFDR Employing a DFB Laser Diode," IEEE Photonics Technology Letters, vol. 3, No. 11, 1991, pp. 1039-1041.

Takada, K. et al., "Loss distribution measurement of silica-based waveguides by using a jaggedness-free optical low coherence reflectometer," Electronics Letters, vol. 30, No. 17, Aug. 18, 1994, pp. 1441-1443.

Takada, K. et al., "Rapidly-tunable narrowband light source with symmetrical crossing configuration for low coherence reflectometry," Electronics Letter, Jan. 5, 1995, vol. 31, No. 1, pp. 63-65.

Takada, K. et al., "Tunable Narrow-Band Light Source Using Two Optical Circulators," IEEE Photonics Technology Letters, vol. 9, No. 1, 1997, pp. 91-93.

Takesue, H. et al., "Broad-Band Lightwave Synthesized Frequency Sweeper Using Synchronous Filtering," Journal of Lightwave Technology, vol. 22, No. 3, Mar. 2004, pp. 755-762.

Telle, J.M. et al., "Very rapid tuning of cw dye laser," Applied Physics Letters, vol. 26, No. 10, 1975, pp. 572-574.

Yun, S.H. et al., "High-speed wavelength-swept semiconductor laser with a polygon-scanner-based wavelength filter," Optics Letters, vol. 28, No. 20, 2003, pp. 1981-1983.

Yun, S.H. et al., "Interrogation of fiber grating sensor arrays with a wavelength-swept fiber laser," Optics Letters, vol. 23, No. 11, 1998, pp. 843-845.

Yun, S.H. et al., "Wavelength-Swept Fiber Laser with Frequency Shifted Feedback and Resonantly Swept Intra-Cavity Acousto-Optic Tunable Filter," IEEE Journal of Selected Topics in Quantum Electronics, vol. 3, No. 4, 1997, pp. 1087-1096.

International Preliminary Report on Patentability dated Mar. 15, 2012 from counterpart International Application No. PCT/US2010/047813, filed Sep. 3, 2010.

Eigenwillig, C.M. et al., "Wavelength swept amplified spontaneous emission source for high speed retinal optical coherence tomography at 1060 nm," Journal of Biophotonics, 2010, pp. 1-7.

Chen, D. et al., "Fiber Bragg Grating Interrogation for a Sensing System Based on a Continuous-Wave Fourier Domain Mode Locking Fiber Laser," Optical Society of America, Conference on Lasers and Electro-Optics (CLEO)/ Quantum Electronics and Laser Science (QELS), Piscataway, NJ, May 4, 2008, pp. 1-2.

Eom, T. J. et al., "Narrowband wavelength selective detector applicable SD-OCT based on Fabry-Perot tunable filter and balanced photoreceiver," Coherence Domain Optical Methods and Optical Coherence Tomography in Biomedicine XII, SPIE vol. 6847, Jan. 21, 2008, pp. 1-7.

Huber, R. et al., "Fourier Domain Mode Locking (FDML): A new laser operating regime and applications for optical coherence tomography," Optical Society of America, Optics Express, vol. 14, No. 8, Apr. 17, 2006, pp. 3325-3237.

Nielsen, F. D. et al., "Semiconductor optical amplifier based swept wavelength source at 1060nm using a scanning Fabry-Perot filter and an YDFA-based booster amplifier," Coherence Domain Optical Methods and Optical Coherence Tomography in Biomedicine XI, SPIE vol. 6429, Jan. 2007, pp. 1-8.

International Search Report, completed on May 31, 2011, from counterpart International Application No. PCT/US2010/047813, filed on Sep. 3, 2010.

Bogatov, A. P., "Anomalous Interaction of spectral Modes in a Semiconductor Laser," IEEE Journal of Quantum Electronics, vol. QE-11, No. 7, Jul. 1975, pp. 510-515.

Eigenwillig, C., "Wavelength swept amplified spontaneous emission source," Optics Express, vol. 17, No. 21, Oct. 12, 2009, pp. 18794-18807.

Eigenwillig, C., "Wavelength swept ASE source," Optical Coherence Tomography and Coherence Techniques IV, edited by Peter E. Andersen, Proc. of SPIE—OSA Biomedical Optics, SPIE vol. 7372, 2009, pp. 737200-1 to 737200-6.

Huber, R., et al, "Amplified, frequency swept lasers for frequency domain reflectometry and OCT imaging: design and scaling principles," Optics Express, vol. 13, No. 9, May 2, 2005, pp. 3513-3528.

Kang, J., "Simple fiber-optic source for optical coherence tomography," SPIE Newsroom, 2008, 2 pages.

Nielson, F. D., et al, "Swept-wavelength source for optic coherence tomography in the 1 μm range," Optics Express, vol. 13, Issue 11, May 2005, pp. 4096-4106.

Pan, J.J., et al, "Fiber Sources: High-power ASE tunable lasers show their colors," Laser Focus World, 2007, available at www.laserfocusworld.com/ARTICLES/308971, 4 pages.

Sheoran, G., et al., "Swept-source digital holography to reconstruct tomographic images," Optics Letters, vol. 34, No. 12, Jun. 15, 2009, pp. 1879-1881.

Tang, Yibing, et al., "A powerful new tool for medical imaging and industrial measurement," SPIE Newsroom, 2008, 2 pages.

Brochure, "Agilent 83437A Broadband Light Source and Agilent 83438A Erbium ASE Source, Product Overview," Agilent Technologies, 1996, 2002.

Fowles, G., "Introduction to Modern Optics," Dover, Second edition, 1975, pp. 85-91.

Gmachl, C. et al., "Ultra-broadband semiconductor laser," Nature, vol. 415, Feb. 21, 2002, pp. 883-887.

Krawczyk, S. K. et al., "GaN and Related Compunds for MEMS and MOEMS," Aromagraph DC 2000 System, vol. 51, No. 8, 1999, pp. 623-625.

Vakhshoori, D. et al., "Raman Amplification Using High-Power Incoherent Semiconductor Pump Sources," Ahara Corporation, MA, 2003.

Zhao, M., et al. "Analysis and Optimization of Intensity Noise Reduction in Spectrum-Sliced WDM Systems Using a Saturated Semiconductor Optical Amplifier," IEEE Photonics Technology Letters, vol. 14, No. 3, pp. 390-392, Mar. 2002.

* cited by examiner

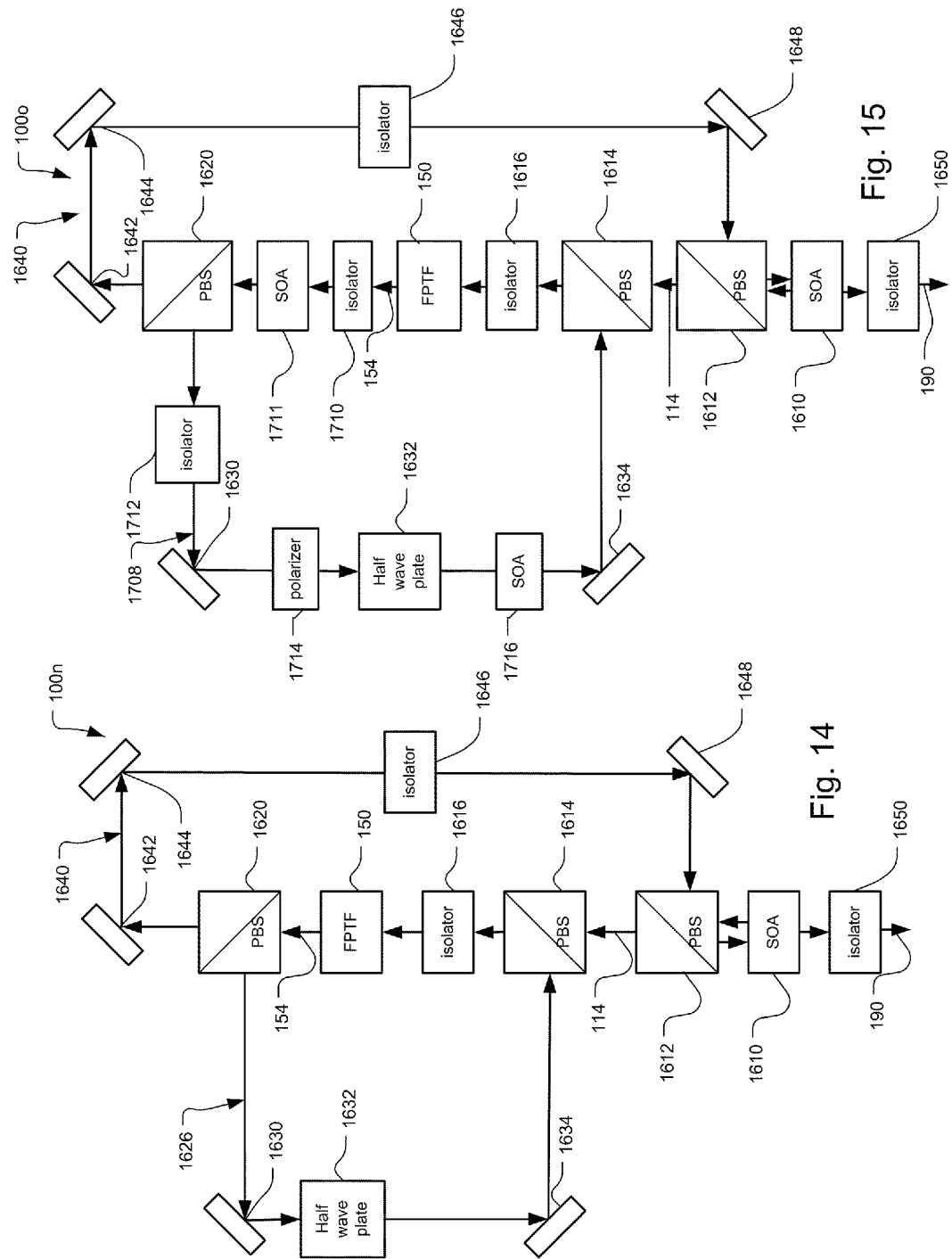

ASE SWEPT SOURCE WITH SELF-TRACKING FILTER FOR OCT MEDICAL IMAGING

RELATED APPLICATIONS

This application is a Continuation-in-Part (CIP) of U.S. application Ser. No. 12/553,295, filed on Sep. 3, 2009, which is incorporated herein by reference in its entirety.

BACKGROUND OF THE INVENTION

Optical coherence analysis relies on the use of the interference phenomena between a reference wave and an experimental wave or between two parts of an experimental wave to measure distances and thicknesses, and calculate indices of refraction of a sample. Optical Coherence Tomography (OCT) is one example technology that is used to perform usually high-resolution cross sectional imaging. It is often applied to imaging biological tissue structures, for example, on microscopic scales in real time. Optical waves are reflected from an object or sample and a computer produces images of cross sections of the object by using information on how the waves are changed upon reflection.

The original OCT imaging technique was time-domain OCT (TD-OCT), which used a movable reference mirror in a Michelson interferometer arrangement. More recently Fourier domain OCT (FD-OCT) has been developed. Two related FD-OCT techniques are time encoded and spectrum encoded OCT. These Fourier domain techniques use either a wavelength swept source and a single detector, sometimes referred to as time-encoded FD-OCT (TEFD-OCT) or swept source OCT, or, alternatively, a broadband source and spectrally resolving detector system, sometimes referred to as spectrum-encoded FD-OCT or SEFD-OCT. These three OCT techniques parallel the three spectroscopy approaches implemented by Fourier transform spectrometers, tunable laser spectrometers, and dispersive grating with detector array spectrometers.

These various OCT techniques offer different performance characteristics. FD-OCT has advantages over time domain OCT (TD-OCT) in speed and signal-to-noise ratio (SNR). Of the two Fourier Domain OCT techniques, swept-source OCT or TEFD-OCT has distinct advantages over SEFD-OCT because of its capability of balanced and polarization diversity detection; it has advantages as well for imaging in wavelength regions where inexpensive and fast detector arrays are not available.

TEFD-OCT or swept source OCT has advantages over SEFD-OCT in some additional respects. The spectral components are not encoded by spatial separation, which requires bulky grating arrangements, but they are encoded in time, which can utilize compact swept wavelength sources. The spectrum is either filtered or generated in successive frequency steps of the swept source and is reconstructed before Fourier-transformation. Using the frequency scanning swept source the optical configuration becomes less complex and more compact, but the critical performance characteristics now reside in the source and especially its tuning speed and accuracy.

The swept sources for TEFD-OCT systems have been typically tunable lasers. The advantages of tunable lasers include high spectral brightness and relatively simple optical designs. The typical tunable laser is constructed from a gain medium, such as a semiconductor optical amplifier (SOA), placed inside an optical laser cavity which includes an intracavity tunable filter, such as a rotating grating, fixed grating with a rotating mirror, or a Fabry-Perot tunable filter. Currently, some of the highest speed TEFD-OCT lasers are based on the laser designs described in U.S. Pat. No. 7,415,049 B1, entitled "Laser with Tilted Multi Spatial Mode Resonator Tuning Element", by D. Flanders, M. Kuznetsov and W. Atia. These highly integrated designs allow for a short laser cavity that keeps the round-trip optical travel times within the laser cavity short, so that the laser is fundamentally capable of high speed tuning Secondly, the use of micro-electro-mechanical system (MEMS) Fabry-Perot tunable filters combines the capability for wide spectral scan bands with the low-mass high mechanical resonant frequency deflectable MEMS membranes that can be tuned rapidly.

Another swept laser source for OCT is the Frequency Domain Modelocked Laser (FDML) as described in U.S. Pat. No. 7,414,779 B2. FDML lasers use semiconductor optical amplifiers in a very long, kilometer or more, fiber ring laser cavities that require polarization control and active length stabilization.

The use of laser-based swept sources, however, does have problems. The instantaneous laser emission is characterized by one or more longitudinal laser cavity modes that simultaneously lase within the passband of the laser's tunable filter. Then as the laser tunes, the power within these modes shifts between the modes and to new cavity modes that see gain as the tunable filter passband shifts. This multi-mode spectral structure of the laser emission increases relative intensity noise (RIN), which degrades performance of OCT systems. Another problem is that tunable lasers using ubiquitous semiconductor gain media generally only tune well in one direction, i.e., to longer wavelengths. This is due to a nonlinear asymmetric gain effect in semiconductors that is often called the Bogatov effect. With an optical signal in a semiconductor at a given wavelength, optical waves at longer wavelengths will experience slightly higher optical gain, while optical waves at shorter wavelengths will experience slightly lower optical gain. Such asymmetric nonlinear gain distribution creates a preference for dynamic tuning in the longer wavelength direction, where optical gain is slightly higher, while impeding tuning in the shorter wavelength direction.

Another limitation of tunable laser sources is that their tuning speed is limited by the round-trip time of the laser cavity. Shortening the laser cavity allows for faster scan speeds, but increases the longitudinal mode spacing and thus reduces the number of modes that can lase within the filter linewidth. The reduced number of lasing mode increases the RIN, and can ultimately lead to mode-hopping. On the other hand, one can increase the filter linewidth to allow a larger number of modes to lase for a lower laser RIN, but this increased laser linewidth results in shorter coherence length that may not be adequate for imaging deeper objects. Potential maximum imaging depth of a swept source OCT system is given by one half the coherence length of the system source, where the coherence length is inversely proportional to the dynamic linewidth of the swept source. Moreover, for a given cavity length and filter linewidth, increasing scan speeds will reduce coherence length and ultimately cause the source to cease lasing.

Another class of swept sources that have the potential to avoid the inherent drawbacks of tunable lasers is filtered amplified spontaneous emission (ASE) sources that combine a broadband light source, typically a source that generates light by ASE, followed by tunable filters and optical amplifiers. Some of the highest speed devices based on this configuration are described in U.S. Pat. No. 7,061,618 B2, entitled Integrated Spectroscopy System, by W. Atia, D. Flanders P. Kotidis, and M. Kuznetsov, which describes spectroscopy engines for diffuse reflectance spectroscopy and other spectroscopic applications such as OCT. A number of variants of the filtered ASE swept source are described including amplified versions and versions with tracking filters.

More recently Eigenwillig, et al. have proposed a variant configuration of the filtered ASE source in an article entitled "Wavelength swept ASE source", Conference Title: Optical Coherence Tomography and Coherence Techniques IV, Munich, Germany, Proc. SPIE 7372, 737200 (Jul. 13, 2009). The article describes a source with an SOA functioning both as an ASE source and first amplification stage. Two Fabry-Perot tunable filters are used in a primary-tracking filter arrangement, which are followed by a second SOA amplification stage.

Such swept filtered ASE sources, while typically more complex optically than some lasers, do provide some performance advantages. For example, they do not have laser optical cavities and thus do not have the laser tuning speed limitations imposed by the finite cavity roundtrip time. Moreover, the lack of the laser cavity avoids the problems associated with the discrete longitudinal laser cavity modes.

SUMMARY OF THE INVENTION

Generally, in the ASE sources, one or more SOA amplification stages are required. This is because the seed broadband ASE source produces light over a wide spectral range. The tunable filter then rejects most of that light allowing only light in the typically narrow spectral passband of the tunable filter to be transmitted. As a result, this narrowband signal is relatively weak in power since most of the light generated by the seed ASE source is rejected and therefore not used. This problem generally does not arise in tunable laser sources since the SOA is located within the laser cavity and generates light predominantly only at the emission wavelengths within the tunable filter passband.

The need for one or more SOA amplification stages, for most applications, necessitates the requirement for one or more tracking filters. This arises because when the relatively weak signal from the primary filter is amplified, there is a large contribution of additive broadband optical noise outside the passband of the primary tunable filter, with the added noise power that is comparable to the signal power itself The tracking filter is thus required in many instances to attenuate this noise outside the passband of the primary filter.

The use of multiple tunable filters creates its own problems, however. The second filter increases the parts count for the system. Additionally, in operation, the filters must be well synchronized. Their passbands must be precisely aligned in wavelength as both filters are being tuned, otherwise the power level of the output signal light will be severely degraded. Moreover, high-speed scanning is often desirable in OCT systems. This further complicates the filter alignment task, requiring very precise high-speed dynamic filter tuning synchronization.

In order to ease the requirements for the filter synchronization, the passband of the tracking filter can be selected to be much wider than the primary filter. In one example the primary filter may have a width of tens of gigahertz (GHz) whereas the tracking filter may have a width of about 100 GHz. This reduces the accuracy with which the tracking filter must track the operation of the primary filter. Both filter order arrangements are possible: (i) the narrow filter can filter the original broadband seed ASE, while the wider tracking filter follows an amplification stage; also (ii) the wider filter can serve to filter the original broadband seed ASE, while the narrower filter then serves to filter ASE of an amplification stage. There is a downside, however, to this narrow-wide filter configuration. The relatively wide tracking filter allows excessive ASE emissions in a band around the signal light. Finally, the filters can drift differently over time, leading to a need to calibrate the filter tuning system or to a complex filter tuning control loop.

Present invention is directed to a swept source that can address some or all of these problems. It uses a tunable filter in a self-tracking configuration. That is, light is passed through the same filter multiple times. This has the effect of applying the filter transfer function on each pass through the tunable filter. This successively narrows the spectral width of the signal, which is desired for narrow linewidth and thus long coherence length operation required for deeper imaging. At the same time, using the filter in this self tracking configuration avoids the need for the complex task of synchronizing tuning of the two filters.

In general according to one aspect, the invention features a swept optical source, comprising: a tunable filter for spectrally filtering light from a source to generate a tunable optical signal that is spectrally tuned over a scanband and an optical amplifier for amplifying the tunable optical signal with the amplified tunable optical signal being filtered by the tunable filter.

In embodiments, the source comprises a broadband source that generates light over the scanband and in implementations is an amplified spontaneous emission source that generates light over the scanband.

In embodiments the tunable filter is a Fabry-Perot tunable filter such as a micro electro mechanical system Fabry Perot tunable filter. Its passband is preferably less than 20 GigaHertz (FWHM) and often less than 5 GigaHertz.

In other embodiments the tunable filter is based on gratings, acousto optic tunable filters or tilt tuned interference/etalon filters.

A tuning controller is preferably used to drive the tunable filter to tune over the scanband at a speeds greater than 10 kiloHertz (kHz) and preferably greater than 100 kHz for some applications.

In the current embodiment, the optical amplifier comprises a semiconductor optical amplifier. In some cases, a reflector is used for reflecting the tunable optical signal to pass through the optical amplifier a second time and back to the tunable filter. In other cases, a loop including the optical amplifier is used for directing the tunable optical signal back to the tunable filter.

A polarization rotation system is used for rotating a polarization of the tunable optical signal between being filtered by the tunable filter; this system includes a non-reciprocal polarization rotation element.

In some embodiments, the filtering by the tunable filter of the tunable optical signal is co-directional with the filtering of the amplified tunable optical signal by the tunable filter, whereas in other embodiments, the filtering by the tunable filter of the tunable optical signal is contra-directional with the filtering of the amplified tunable optical signal by the tunable filter.

In general according to another aspect, the invention features a method for generating a tunable optical signal, comprising spectrally filtering light to generate a tunable optical signal with a tunable filter that is spectrally tuned over a scanband, amplifying the tunable optical signal to generate an amplified tunable optical signal, and spectrally filtering the amplified tunable optical signal with the same tunable filter.

In general according to still another aspect, the invention features tunable amplifier comprising a tunable filter for spectrally filtering light to generate a tunable optical signal that is spectrally tunable over a spectral band and an optical amplifier for amplifying the tunable optical signal with the amplified tunable optical signal being filtered by the tunable filter.

In general according to still another aspect, the invention features a swept optical source comprising a tunable filter for spectrally filtering light from a source to generate a tunable optical signal that is spectrally tuned over a scanband, an optical amplifier for amplifying the tunable optical signal in a first pass, and a reflector for reflecting the tunable optical signal to pass through the optical amplifier in a second pass.

In general according to still another aspect, the invention features an optical coherence analysis system comprising a swept source including a tunable filter for spectrally filtering light from a source to generate a tunable optical signal that is spectrally tuned over a scanband and an optical amplifier for amplifying the tunable optical signal with the amplified tunable optical signal being filtered by the tunable filter. A Michelson interferometer divides the amplified tunable optical signal between a reference arm and a sample arm and generates an interference signal by combining the optical signal from the reference arm and the sample arm. Finally, a detector system detects the interference signal.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings:

FIG. 14 is a block diagram of a swept optical source with a co-directional dual-pass self-tracking filter using polarization diversity with dual loops according to a fourteenth embodiment of the present invention;

FIG. 15 is a block diagram of a swept optical source with a co-directional self-tracking filter in an amplified dual-pass loop using polarization diversity and a second output loop according to a fifteenth embodiment of the present invention.

DETAILED DESCRIPTION OF THE PREFERRED EMBODIMENTS

Figure 1:
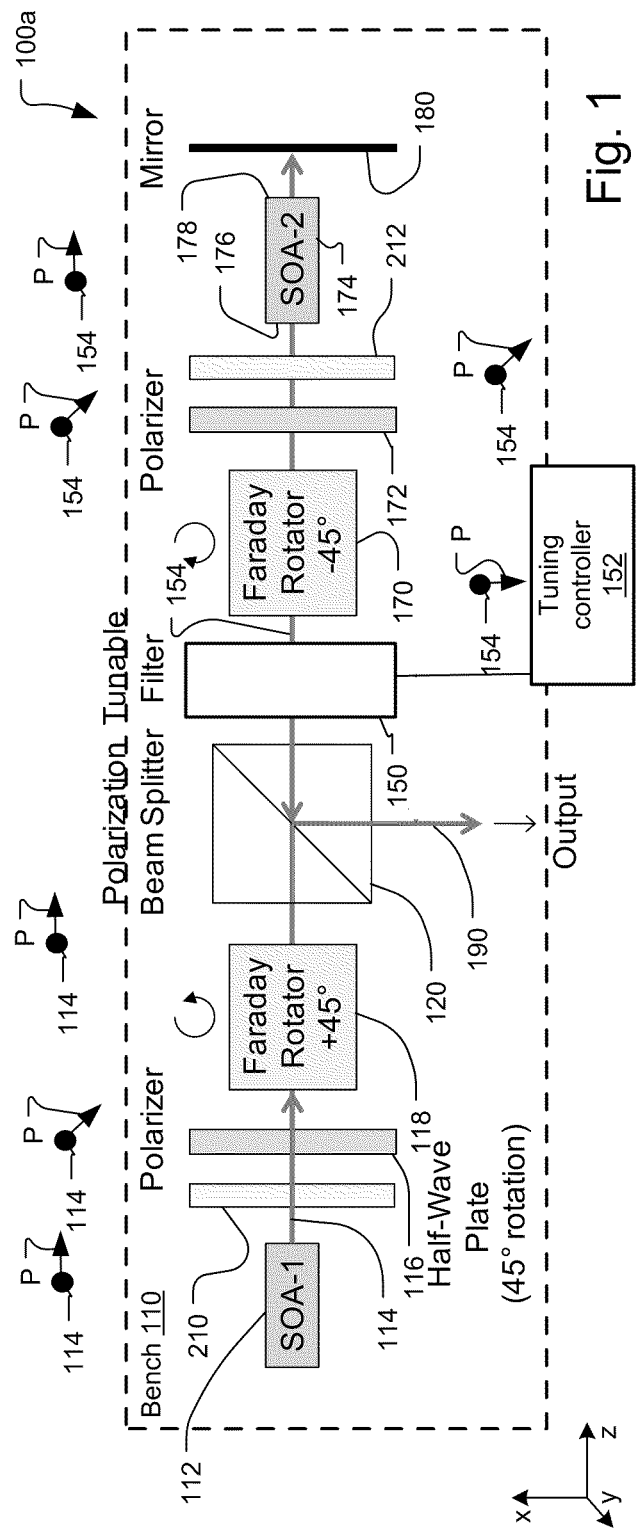
FIG. 1 is a block diagram of a swept optical source with a contra-directional self-tracking filter using polarization diversity and a double-pass reflective amplification stage according to a first embodiment of the present invention.

In the following description similar components in the different embodiments are given the same or similar reference numerals to indicate similar construction and functionality.

FIG. 1 shows a first embodiment swept optical source 100a with contra-directional self-tracking filter using polarization diversity and a reflective, double-pass amplification stage, which has been constructed according to the principles of the present invention.

Preferably, the source 100a is entirely implemented on a single bench 110 with free space optics coupling the optical beams between the optical elements. In the coordinate system of the figure, the bench extends in the x-z plane and the y-axis extends vertically from the plane of the bench.

In other examples, many or most of the optical elements are implemented in common on a single optical bench. In yet other examples, two or more separate optical benches are used to implement the swept source, placing some optical components on one bench and other optical components on another bench, with free-space or optical fiber connections between different benches.

The use of the optical bench and free space optics in this and the other embodiments is important for at least two reasons. In this and the other disclosed embodiments, the self-tracking filter is implemented using a polarization diversity scheme. The use of the single optical bench eases the assembly requirements to ensure that the orthogonal polarizations pass through the self-tracking filter. When using optical fiber connections, it can be difficult to ensure proper polarization alignment of the different optical signals in the system. Moreover, using standard single-mode fiber causes a randomized polarization state of the output light requiring polarization controllers between elements. Additionally, the use of the self tracking filter in a high speed tuning source requires that there is only a small time delay between the separate transits of the optical signals through the typically rapidly-tuned self-tracking filter. As the tuning speed of the system increases, only smaller and smaller time delays are tolerable. The implementation on a single, e.g. micro-optical, bench with little or no fiber links ensures that the system has very short optical propagation time delays and is able to operate at very high tuning speeds.

The bench 110 is termed a micro-optical bench and is preferably less than 10 millimeters (mm) in width and about 20 mm in length or less. This size enables the bench 110 to be installed in a standard, or near standard-sized, butterfly or DIP (dual inline pin) hermetic package. In one implementation, the bench 110 is fabricated from aluminum nitride. A thermoelectric cooler is disposed between the bench 110 and the package (attached/solder bonded both to the backside of the bench and inner bottom panel of the package) to control the temperature of the bench 110.

The swept source 100a comprises a broadband source 112 that generates a broadband optical signal. In general, the broadband signal is characterized by a continuous spectrum that extends in wavelength over at least 40 nanometers (nm) of bandwidth, full width half maximum (FWHM). Typically, the continuous spectrum extends over at least 70 nm and preferably over 100 nm or more.

In the current embodiments described herein, the proposed filtered swept sources start with a broadband amplified spontaneous emission (ASE) source. Semiconductor optical amplifiers, or SOAs, are effective sources of such broadband ASE. SOAs are typically configured with an optical input and an optical output for input light amplification. With no input light, only ASE appears at the SOA output. Sometimes superluminescent light emitting diodes, or SLEDs, are used as broadband ASE sources. SLEDs are typically SOAs configured with an optical access to the output ASE signal and no optical access to the SOA input.

In the preferred embodiment, the broadband source 112 is an electrically pumped semiconductor diode chip gain medium that is bonded or attached to a bench 110. Such devices generate the broadband light by ASE. Common examples of the source 112 include superluminescent light emitting diodes (SLED) and semiconductor optical amplifiers (SOA) implemented in a SLED configuration, i.e. functioning to generate ASE light. Such broadband ASE sources are often fabricated, for example, near 840 nanometer (nm), 1060 nm, or 1310 nm center wavelengths.

The material system of the chip gain medium is selected based on the desired spectral operating range. Common material systems are based on III-V semiconductor materials, including binary materials, such as GaN, GaAs, InP, GaSb, InAs, as well as ternary, quaternary, and pentenary alloys, such as InGaN, InAlGaN, InGaP, AlGaAs, InGaAs, GaInNAs, GaInNAsSb, AlInGaAs, InGaAsP, AlGaAsSb, AlGaInAsSb, AlAsSb, InGaSb, InAsSb, and InGaAsSb. Collectively, these material systems support operating wavelengths from about 400 nm to 2000 nm, including longer wavelength ranges extending into multiple micrometer wavelengths. Semiconductor quantum well and quantum dot gain regions are typically used to obtain especially wide gain bandwidths. Currently, edge-emitting chips are used although vertical cavity surface emitting laser (VCSEL) chips can be used in different implementations.

The use of a semiconductor chip gain medium for the source 112 has advantages in terms of system integration since it can be bonded to a submount that in turn is directly bonded to a bench 110. Other possible gain media can be used in other implementations, however. In these examples, the broadband signal is typically transmitted via optical fiber to the bench 110. Such examples include solid state gain media, such as rare-earth (e.g., Yb, Er, Tm) doped crystals, bulk glass, waveguides or optical fiber.

In these examples, the output facets of the chips or gain waveguides/fibers are antireflection coated, and possibly angled, so that output ASE signal is not fed back into the gain medium and the gain medium does not lase but instead generates broadband light via ASE. Sometimes two co-directional or contra-directional optical passes through the SOA amplifier are used. Presence of repetitive periodic optical feedback into the gain medium, such as from an optical cavity, would result in device lasing and would destroy the required operating regime of the filtered ASE swept source, for example by making the device non tunable. In all of the proposed ASE swept source configurations here, great effort, such as by use of isolators, is expended to prevent the formation of optical cavities about the gain elements and thus to prevent device from lasing, which would destroy the device operation.

The broadband source 112 in this and the other embodiments is not limited to only sources that generate light via ASE. In other embodiments, the broadband source 112 is implemented as a supercontinuum source based on nonlinear fiber, a Raman light source, or a parametric light source, for example.

The broadband optical signal 114 from the broadband source 112 is typically highly polarized. This is a characteristic of light generated by quantum-well gain semiconductor chips. In the most common quantum-well SOA or SLED ASE source, light is polarized in the plane of the optical wafer or the chip, commonly referred to as TE polarization. In the illustrated embodiment, the broadband optical signal 114 is polarized in a direction that is parallel to the surface of the bench 110. This is illustrated in the series of inset diagrams that show the angle of polarization P from the perspective of the optical signal 114, looking into the beam, along its optical axis of propagation.

Other SOA or SLED chips have light polarized perpendicular to the plane of the chip, commonly referred to as TM polarization. If such chips are used, broadband optical signal 114 will be polarized in a direction that is perpendicular to the surface of the bench 110. Either polarization type, TE or TM, source or amplifier can be used in the filtered source arrangements, as long as proper polarization orientation and rotation is arranged along the optical beam path.

A first halfwave plate 210 rotates the polarization of the broadband signal by 45 degrees. A polarizer 116 filters the rotated broadband signal 114 from the broadband source 112. The polarizer is oriented to be parallel to the predominant polarization of the broadband signal 112 as rotated by the halfwave plate 210. As a result, the broadband signal 114 passes through the polarizer 116.

A first broadband non-reciprocal rotator, or Faraday rotator, 118 rotates the polarization of the broadband signal back 45° so that the beam again has a horizontal polarization.

The broadband signal from the Faraday rotator 118 is transmitted to a polarization beam splitter (PBS) 120. The orientation of the PBS 120 is configured to transmit the broadband signal 114, at the horizontal polarization angle in the illustrated implementation. Thus the broadband signal 114 is transmitted directly through the PBS 120. Typically, the highly polarized output characteristic of semiconductor gain media ensures a high transmission efficiency.

In other implementations, the polarization beam splitter 176 is implemented as a polarizing coating or a birefringent walk-off polarizer.

In still another implementation, a circulator is used instead of the PBS 120. Further a simple beam splitter or coupler is used in other examples. This is considered as suboptimal due to the concomitant optical losses, however.

A self-tracking tunable filter 150 in this and the other embodiments functions first as a tunable bandpass filter to convert the broadband signal 114 to a narrow band tunable signal 154. In a current embodiment, the passband of the self-tracking tunable filter 150 has a full width half maximum (FWHM) bandwidth of less than 20 or 10 GigaHertz (GHz), and is preferably 5 GHz or less. For spectroscopy this relatively narrow passband yields high spectral resolution. For optical coherence tomography, this high spectral resolution implies a long coherence length of the source and therefore enables imaging deeper into samples, for example deeper than 5 mm. In lower performance applications, for example OCT imaging less than 1 mm deep into samples, broader FWHM passbands are sometimes appropriate, such as passbands of about 200 GHz or less.

the self-tracking tunable filter 150 in this and the other embodiments is preferably a Fabry-Perot tunable filter that is fabricated using micro-electro-mechanical systems (MEMS) technology and is attached, such as directly solder bonded, to the bench 110. Currently, the filter 150 is manufactured as described in U.S. Pat. Nos. 6,608,711 or 6,373,632, which are incorporated herein by this reference. A curved-flat resonator structure is used in which a generally flat mirror and an opposed curved mirror define a filter optical cavity, the optical length of which is modulated by electrostatic deflection of at least one of the mirrors.

In the current embodiment, the filter is installed perpendicular to the optical axis and is oriented with the fixed mirror on the side nearest the amplification stage. The membrane side is more sensitive to photon pressure. Thus, orienting the filter such that the post amplification side hits the fixed mirror first is preferable.

In this and the other embodiments described hereinbelow, other tunable filters and spectral filter technologies are possible. In some implementations, grating based filters are used including rotating gratings and gratings with rotating mirrors. Further, in still other implementations other Fabry-Perot filter technologies are used including piezoelectrically and thermally tuned Fabry-Perot filters. In still further examples angle-tuned, including spinning Fabry-Perot etalons and angle-tuned, including spinning, interference filters are used. Thin film interference filter is a group of several coupled FP filters formed by depositing thin-film reflective coatings with intervening spacers onto a substrate; these are used widely for wavelength division multiplexing (WDM) channel selection applications. Acousto-optic tunable filters (AOTF) are another alternative.

Tuning controller 152 in this and the other embodiments drives the self-tracking tunable filter 150. Preferably, the tuning controller 152 tunes the passband over the scanband extending over the gain band of broadband source 112. In the illustrated embodiment, this is achieved by modulating the electrostatic drive voltage applied to the MEMS tunable filter. Particularly, passband is tuned over a scanband that covers the continuous spectrum associated with broadband optical signal 114 and thus tunes over a spectral scan band of about 70 nm to 100 nm or greater. Other wavelength tuning ranges are greater than (i) 10 nm, (ii) 40 nm, (iii) 80 nm.

The swept optical source 100a and the other embodiments discussed hereinbelow are generally intended for high speed tuning to generate tunable optical signal that scans over the scanband at speeds greater than 10 kiloHertz (kHz). In current embodiments, the swept optical source 100a tunes at speeds greater than 50 or 100 kHz. In very high speed embodiments, the swept optical source 100a tunes at speeds greater than 200 or 500 kHz, or faster.

The tuning controller 152 provides a tuning voltage function that sweeps the passband optical frequency across the tuning band, preferably with optical frequency varying linearly with time. The tuning controller also preferably provides bidirectional tunable filter sweeps, in the up and down wavelength tuning directions in a sawtooth fashion. Alternatively, the tuning controller provides unidirectional wavelength tuning sweeps, for example in the up tuning wavelength direction, with fast sweep retrace for a high duty cycle linear in time frequency sweep.

The tuning speed provided by the tuning controller is also expressed in wavelength per unit time. In one example, for an approximately 110 nm tuning range or scan band and 100 kHz scan rate, assuming 60% duty cycle for substantially linear up-tuning, the peak sweep speed would be 110 nm*100 kHz/0.60=18,300 nm/msec=18.3 nm/μsec. In another example, for an approximately 90 nm tuning range and 50 kHz scan rate, assuming a 50% duty cycle for substantially linear up-tuning, the peak sweep speed is 90 nm*50 kHz/0.50=9,000 nm/msec=9.0 nm/μsec. In a smaller scan band example having an approximately 30 nm tuning range and 2 kHz scan rate, assuming a 80% duty cycle for substantially linear up-tuning, the peak sweep speed would be 30 nm*2 kHz/0.80=75 nm/msec=0.075 nm/μsec Thus, in terms of scan rates, in the preferred embodiments described herein, the sweep speeds are greater than 0.05 nm/μsec, and preferably greater than 5 nm/μsec. In still higher speed applications, the scan rates are higher than 10 nm/μsec.

Light that is outside the passband, in the case of a Fabry-Perot tunable filter, is reflected. This reflected light, however, does not form a laser cavity with the current configuration around the broadband source 112. Any back-reflected light from the tunable filter 150 is further rotated by the non-reciprocal, or Faraday, rotator 118 to have a polarization that is now perpendicular to the axis of the polarizer 116 due to the non-reciprocal operation of the Faraday rotator 118. The reflected light is thus stopped by the polarizer 116. This prevents feedback into the broadband source 112 that might cause lasing or otherwise change, e.g. produce ripple in, the emission spectrum of the broadband optical signal from the broadband source 112. If the source 112 starts lasing on the broadband reflection from the tunable filter 150, the lasing will occur near the spectral gain peak of the source and will not tune spectrally with the tunable filter tuning, thus destroying the intended and required swept frequency operation of the source.

The tunable optical signal 154 that is produced by the passband of the self-tracking tunable filter 150 is transmitted to a second non-reciprocal, Faraday, rotator 170. The orientation of the second Faraday rotator 170 is reverse to the first Faraday rotator 118. As a result, the polarization of the tunable optical signal is rotated by 45 degrees.

The tunable optical signal is then transmitted through a second polarizer 172. The orientation of the second polarizer transmits light having a polarization that is rotated 45 degrees with respect to horizontal. A subsequent halfwave plate 212 rotates the polarization back to horizontal. As a result, the tunable signal from the second Faraday rotator 170 is substantially transmitted to an optical amplifier 174.

Preferably the optical amplifier 174 in this and the other embodiments is an SOA with antireflection coated and angled front facet 176, enabling integration onto the bench 110 by attachment, typically via a submount. The tunable signal is amplified in the semiconductor optical amplifier 174 in a double pass reflective arrangement. The horizontal polarization allows standard edge-emitting gain chips be used in a standard flat, planar installation on the bench 110.

In one embodiment, a single angled facet (SAF) SOA is used to amplify the tunable signal in a first pass through the SOA. Then the reflected signal from a reflective back facet is amplified in the SOA for a second time with the amplified light exiting the front facet of the SOA chip 174.

In the illustrated embodiment, the SOA 174 has antireflection coated front facet 176 and back facet 178. Light exiting from the back facet 178 is coupled to a discrete mirror 180 that reflects the light back into the back facet 178 for the second pass through the SOA 174. The two contra-directional light passes through the SOA 174 have light in the same polarization orientation; thus a single polarization, that is polarization sensitive, SOA amplifier can be used here.

Light exiting out of the front facet 176 of the SOA 174 is transmitted through the halfwave plate 212 and the second polarizer 172 to the second Faraday rotator 170. The tunable optical signal passing through the tunable filter 150 a second time, now in the direction opposite to the first passage, ensures that the noise outside the passband of the tunable filter is further attenuated and the linewidth of the tunable signal is further narrowed.

Light that is rejected or reflected by the self tracking filter 150 is filtered by the second polarizer 172. In more detail, the second polarizer 172 prevents, filters, light returning from the tunable filter 150 through the Faraday rotator 170 from reaching to the SOA amplifier chip 174. That is, light reflected by the tunable filter 150, for example, passes through the Faraday rotator 170 a total of two times and thus is rotated by 90 degrees and thus is absorbed by the second polarizer 172. This prevents the formation of a laser cavity, which here would destroy the device operation.

The polarization of the light from the SOA 174 and passing through the tunable filter 150 has a polarization that is orthogonal to the original polarization of the broadband signal 114 generated by the broadband source 112. This is due to the double pass of the tunable signal through the Faraday rotator 170. As a result, the tunable signal is now at a polarization that is reflected by the PBS 120, perpendicular to the plane of the bench 110. Thus the tunable signal 154 exits as the output signal 190.

Preferably, in this embodiment and the other embodiments discussed here, all of the optical components, are connected to a single, common optical bench 110, such as by solder bonding. In the illustrated embodiment, coupling or collimation optics such as micro lenses are not shown in the optical train for ease of illustration. Generally, lenses are required at least at the exit facets of the semiconductor chips, i.e, broadband source 112 and SOA 174, and to couple light into and out of the tunable filter 150. In more detail, with respect to the present embodiment, broadband source 112, first polarizer 116, the first halfwave plate 210, first Faraday rotator 118, PBS 120, tunable filter 150, second Faraday rotator 170, second polarizer 172, second halfwave plate 212, SOA 174, and mirror 180 are connected to a common bench 110.

Alternatively, in other implementations, two or more benches are used.

In the illustrated example, the two halfwave plates 210, 212 are not strictly necessary. If removed, the beams would have a 45 degree polarization at the PBS 120. To accommodate such polarizations, however, non-standard optical components are required, which could impact the overall cost and performance.

Figure 18:
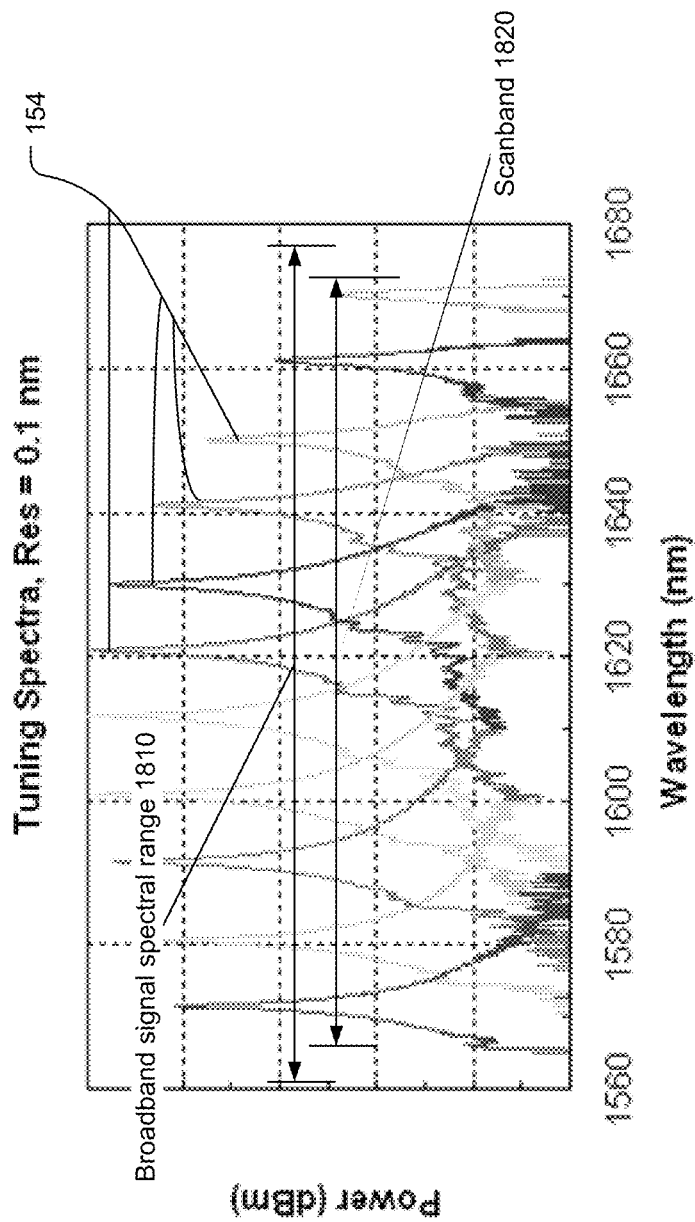
FIG. 18 is a plot of power as a function of wavelength (nanometers) showing the relationship between the spectral extent of the broadband optical signal, the scanband, and the tunable optical signal.

FIG. 18 illustrates the relationship between the spectral extent of the broadband optical signal, the scanband and the tunable output optical signal 190. In more detail, the broadband source 112 emits or produces useful levels of optical energy over a spectral range 1810. The passband of the tunable filter 150 is then tuned over the scanband 1820 that covers the desired spectral scanning region of the broadband source's range 1810. This process produces the narrowband tunable output optical signal 190 that is then tuned over that scanband 1820.

Figure 2:
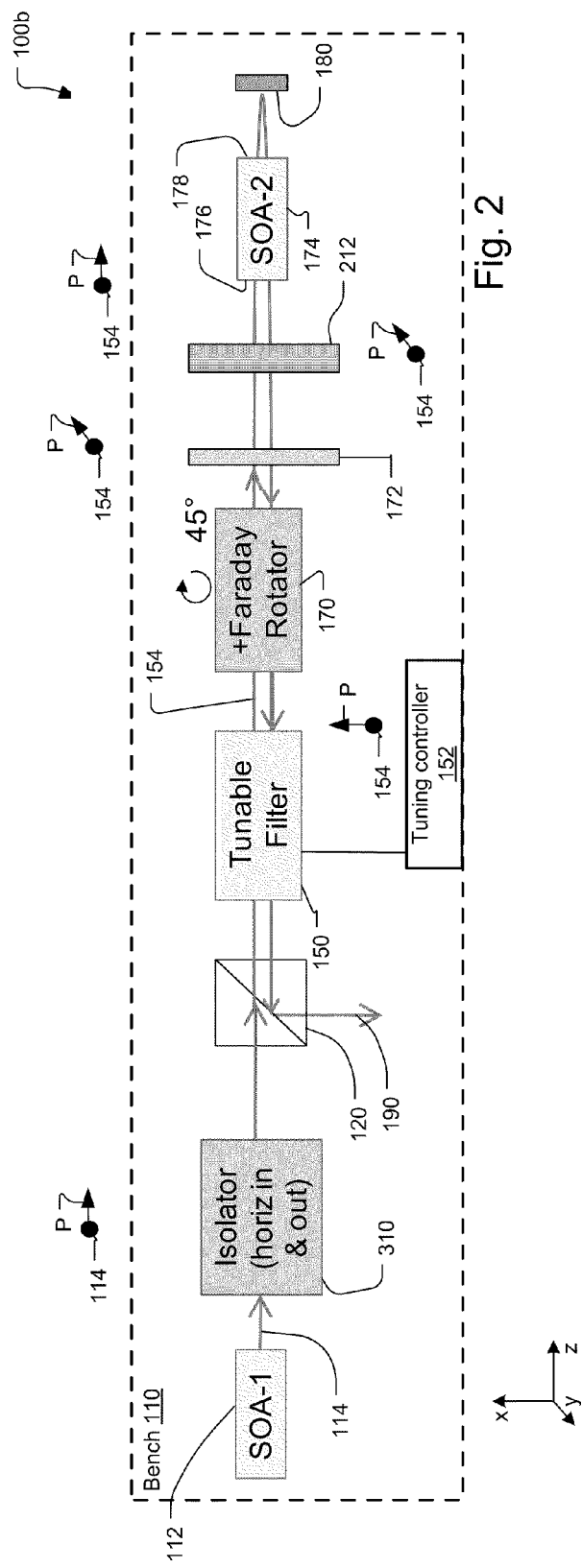
FIG. 2 is a block diagram of a swept optical source with a contra-directional self-tracking filter using polarization diversity and a double-pass reflective amplification stage using an isolator according to a second embodiment of the present invention.

FIG. 2 shows a swept optical source 100b that is a variant of the FIG. 1 embodiment swept optical source 100a, also incorporating a contra-directional self tracking filter using polarization diversity and double pass reflective amplification stage.

Generally, the description of the preceding swept optical source 100a applies to this embodiment 100b, with some exceptions.

The light 114 generated by the broadband source 112 passes through an isolator 310. This is a polarization preserving isolator. Thus in the illustrated embodiment, the horizontal polarization light P emitted by the broadband source 112 exits the isolator 310 with that same parallel polarization.

The isolator 310 replaces the first polarizer 210, the half wave plate 116 and the first Faraday rotator 118 of the FIG. 1 embodiment.

The PBS 120 is oriented to transmit light in the horizontal polarization. This parallel light passes through the tunable filter 150. In the Faraday rotator 170, light is rotated to a 45° angle. The polarizer 172 is oriented to pass light at the 45° polarization angle. In the subsequent halfwave plate 212, the light is rotated to a horizontal polarization that is amplified in the SOA optical amplifier 174. Light returning from the SOA 174 passes through the halfwave plate 212, polarizer 172 and the Faraday rotator 170 and is now polarized in a direction that is vertical to the bench 110 and is thus reflected by the PBS 120 as the output signal 190.

Figure 3:
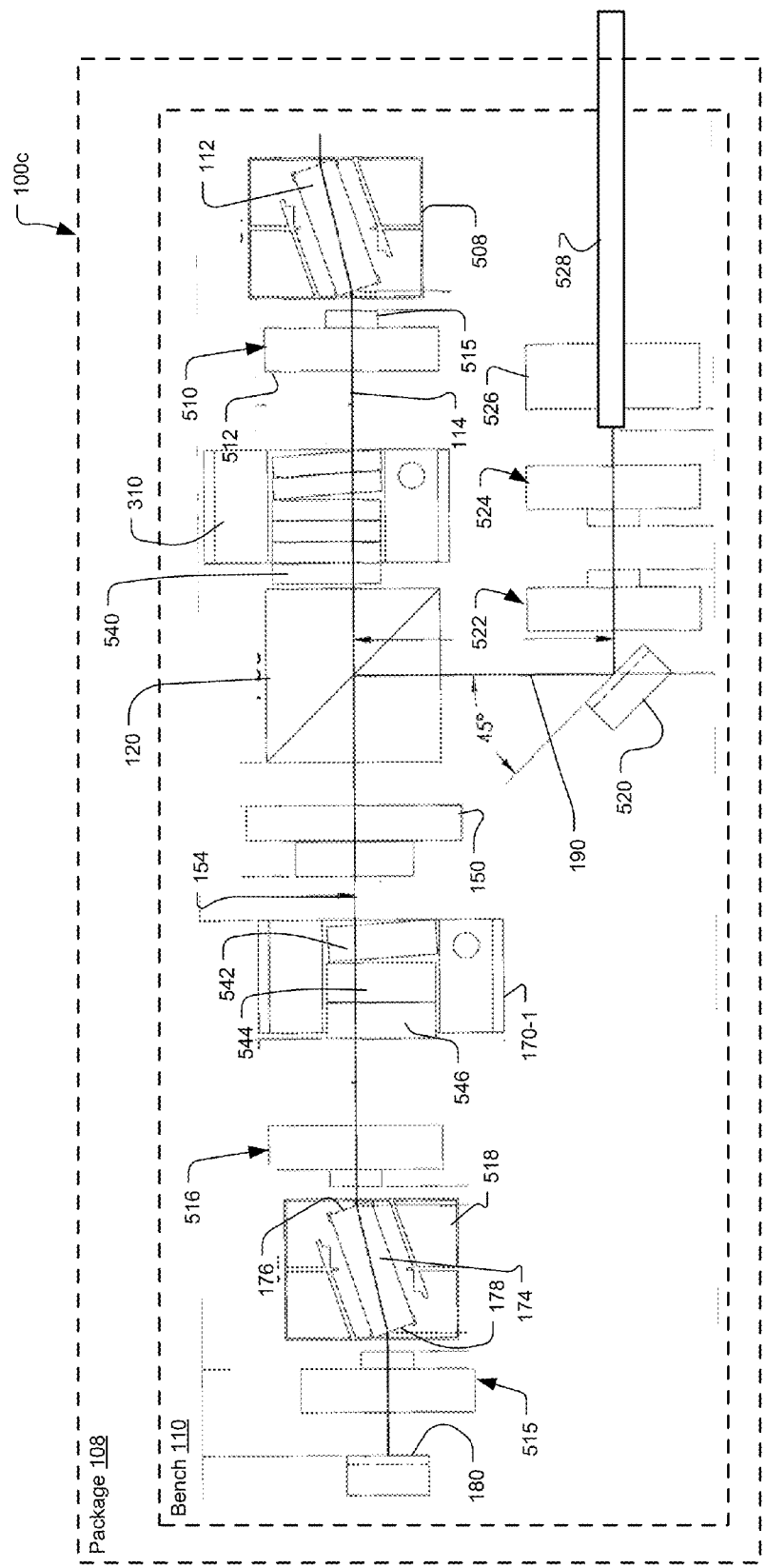
FIG. 3 is a scale plan view of a swept optical source with a contra-directional self-tracking filter using polarization diversity and a double-pass reflective amplification stage using an isolator according to a third embodiment of the present invention.

FIG. 3 is a scale view of a swept optical source 100c with a self-tracking filter using polarization diversity that is closely related to the FIG. 2 embodiment swept optical source 100b.

This figure is useful in showing an actual implementation of a swept source on the bench 110. It shows the coupling optics, lenses, that are used to couple the optical signal in and out of the elements on the bench.

In more detail, the broadband source 112 is implemented as a SLED or a SOA in a SLED implementation. The source 112 is installed on a sub mount 508. The sub mount in turn is bonded to the bench 110. Typically solder bonding is used between the source chip 112 and the submount 508, and between the submount 508 and the bench 110.

Light exiting the back facet of the SOA 112 is typically lost, or captured by a beam dump, or constitutes stray light within the hermetic butterfly package 108 containing the bench 110.

Light exiting the front facet of the SOA 112 is collimated by a first lens structure 510. In the preferred embodiment, the lens structure 510, and the other lens structures in the source, comprises a mounting structure 512 that is solder bonded to the bench 110. A lens substrate 515 is bonded to the mounting structure 512. Preferably, the mounting structure is deformable to enable post installation alignment. That is, after solder bonding to the bench 110 the mounting structured 512 is deformed to ensure that the lens substrate 515 is aligned with respect to the optical axis of the optical signal that is transmitted through the lens substrate. The technology is generally described in U.S. Pat. No. 6,416,937 B1.

A collimated broadband signal 114 from the SOA 112 is coupled into an isolator 310. This prevents back reflections in the SOA 112 to prevent lasing. In the illustrated embodiment, the isolator 310 is a semi double stage isolator. It comprises a series of elements: a polarizer followed by a Faraday rotator followed by a polarizer followed by a Faraday rotator and followed by a final polarizer. A final halfwave plate 540 is added to the back of the polarizer to rotate the broadband signal back to a horizontal polarization.

Light exiting the isolator 310 is coupled into a PBS 120. PBS is configured to transmit light that having the polarization of the broadband source 112. In a typical embodiment, the PBS transmits a polarization that is horizontal with respect to the surface of the bench 110 and reflects light at a polarization that is vertical to the surface of the bench 110.

The light transmitted through the PBS 120 is coupled to a tunable filter 150. This converts the broadband signal 114 into a narrowband tunable signal 154.

A non reciprocal rotator component 170-1 receives the narrowband tunable signal 154 from the tunable filter 150. This rotates the polarization 45°. The rotator 170 also includes a polarizer. In more detail, rotator 170 includes a Faraday rotator 542, a polarizer 544, and a halfwave plate 546, which rotates the polarization back to input polarization.

The light exiting the rotator component 170-1 is collimated by a second lens component 516 and coupled into the front facet 176 of the SOA amplifier chip 174. As described previously, a submount 518 connects the SOA 174 to the bench 110. Light exiting the back facet 178 of the SOA 174 is collimated by a third lens component 515, reflected by the mirror 180, and coupled back into the back facet 178 of the SOA 174. Thus, the tunable signal is amplified in the SOA in a double pass reflective arrangement.

The light exiting the front facet 176 of the SOA 174 is collimated by the second lens component 516 and transmitted through the rotator component 170-1. This rotates the polarization of the tunable optical signal 154 such that after it is filtered by the tunable filter 150 the second time, the optical signal 154 is reflected by the PBS 120, which is vertical in the current embodiment. The two passages of light through the tunable filter are in the opposite directions and with orthogonal polarizations.

The vertically polarized light that is reflected by the tunable filter 150 as being outside of the passband is absorbed by the polarizer 544 in the rotator component 170-1.

In the illustrated example, the optical path for the output signal 190 is folded to yield a compact design. In more detail, the output signal 190, from the PBS 120, is reflected by a fold mirror 520 so that the output optical signal is again heading in a direction that is parallel to the broadband signal 114. The output signal is collimated by a fourth lens component 522 and then focused by a fifth lens component 524 onto the entrance facet of an optical fiber 528. The optical fiber 528 is secured to the bench 110 via a fiber mounting structure 526. Preferably, this mounting structure is also deformable after solder bonding to the optical bench 110 to enable posts installation alignment of the entrance facet relative to the surface of the optical bench 110. The optical fiber exits the hermetic package 108 via a fiber feedthrough. Both single mode fibers and polarization maintaining fibers, as well as single polarization fibers, are used in different implementations for the device output fiber 528.

The embodiments described with respect to FIGS. 1 through 3 share a common characteristic in terms of the SOA or optical amplifier 174. A double pass arrangement is used in which the tunable signal is reflected to pass through the SOA 174 twice. As described, with respect to the embodiments, this can be achieved by using a discrete reflector such as the mirror (180) or an SAF SOA chip that has an integrated reflector, which is used in other examples.

Under current technology, however, a problem arises with respect to the isolation that can be obtained for the SOA 174. In this double pass configuration, nearly twice as much isolation is required due to the gain provided by the chip. For example, current chips offer approximately 30 dB of gain. As a result, at least 60 dB of isolation is required to prevent lasing. Moreover, in many instances, the system functions over a tuning range of 100 nm or more. Faraday rotators and half wave plates functioning over such a bandwidth typically cannot provide sufficient isolation. This is typically due to the fact that the halfwave plate and Faraday rotators only function adequately for the specified center wavelengths and not over the entire scan band. The polarization crosstalk can lead to lasing especially near the edges of the scanband.

Figure 4:
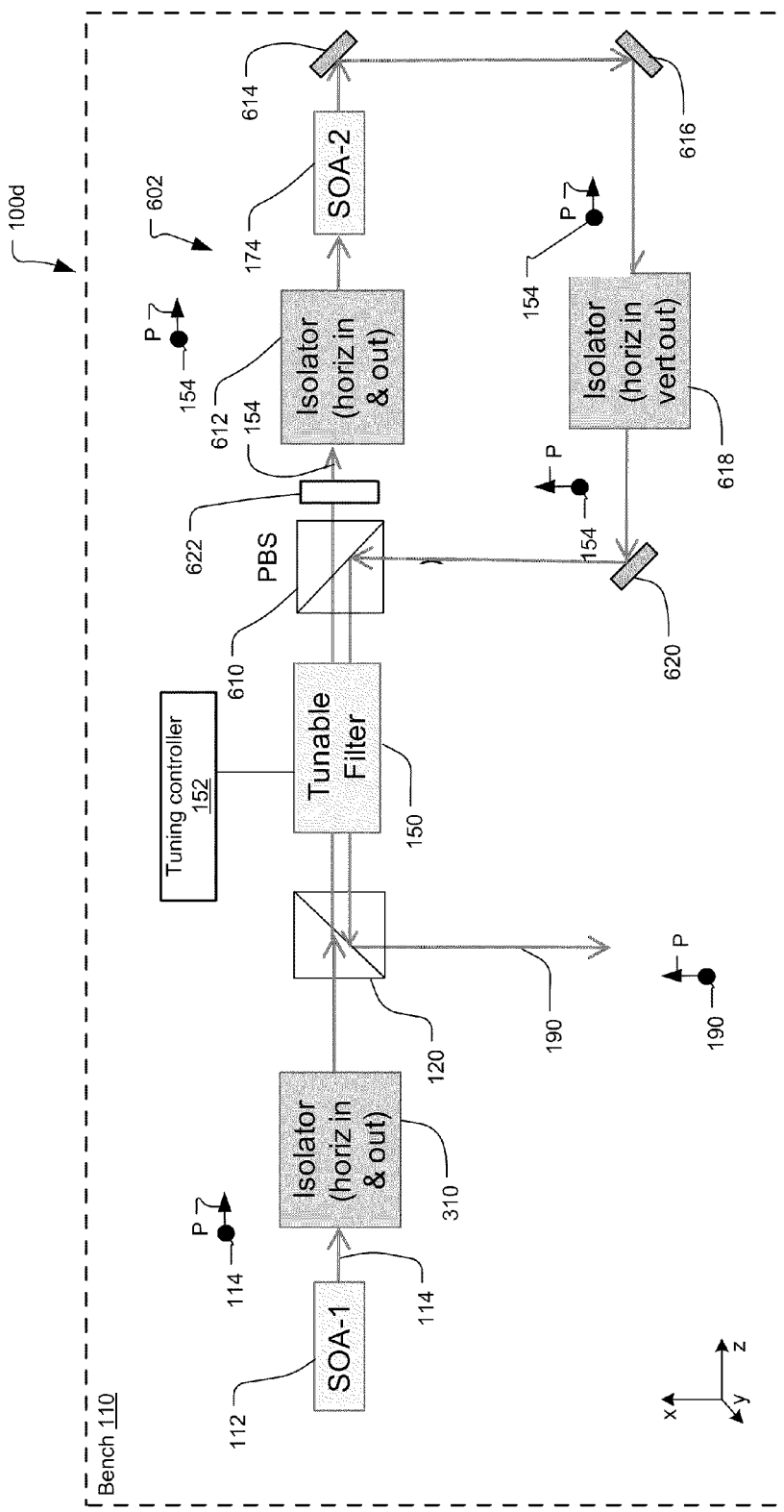
FIG. 4 is a block diagram of a swept optical source with a contra-directional self-tracking filter using polarization diversity with a loop amplification stage according to a fourth embodiment of the present invention.

FIG. 4 shows a swept optical source 100d with a contradirectional self tracking filter using polarization diversity with a loop amplification stage 602.

In more detail, the broadband source 112 generates polarized light that is polarized horizontally with respect to the bench 110. A subsequent isolator 310 prevents back reflections into the broadband source 112.

In the preferred embodiment the broadband source 112 can be an SLED, or an SOA functioning in an SLED configuration or other broadband source such as those mentioned previously.

In the current embodiment, the broadband source 112 produces horizontally polarized light, the polarization of which is unchanged by the isolator 310.

A PBS 120 transmits the polarized light from the source 112, typically horizontally polarized light, and reflects oppositely polarized light. Thus, the broadband signal 114 is coupled into the tunable filter 150, which converts the broadband signal 114 into the narrowband tunable signal 154. The light is transmitted through a loop PBS 610. A first loop isolator 612 provides isolation for a subsequent amplifier, or SOA, 174. In the preferred embodiment, the first loop isolator 612 preserves the polarization of the input light.

Two fold mirrors 614 and 616 redirect the tunable signal 154. A second loop isolator 618 is also provided in the loop 602. A third fold mirror 620 turns the tunable optical signal 154 to the loop PBS 610.

The second loop isolator 618 rotates the polarization of the tunable signal from a direction that is horizontal with respect to the surface of the bench 110 to a vertical polarization. As a result, the loop PBS 610 reflects the tunable signal back, i.e. to pass through the tunable filter 150 a second time in the opposite direction and with orthogonal polarization to the first pass.

In the preferred embodiment, a polarizer or polarizing filter 622 is located between the loop PBS 610 and the first loop isolator 612. This polarizer 622 prevents reflections of the tunable filter 150 from inducing lasing in the loop 602. So in the illustrated embodiment, the polarizer blocks vertically polarized light.

The tunable optical signal 154 that is transmitted through the tunable filter 150 now has a polarization that is vertical with respect to the bench 110. As a result, it is reflected by the PBS 120 as the output signal 190.

In this embodiment, the transit time of the optical signal through the loop 602 is relevant to the proper operation of the swept source 100d. If the loop is relatively long in optical distance and the tuning speed of the tunable filter 150 is high and/or the bandwidth of the tunable filter's passband is narrow, it could arise that the tunable filter 150 shifts between the time that the tunable signal 154 is transmitted into the loop 602 and the time that the tunable signal exits from the loop and passes to the tunable filter 150 as the output signal 190. In this case, the tunable signal will be reflected and the output power will be low. This fact necessitates an integrated small-time-delay design with little or no optical fiber in the loop 602. In fact, in the preferred embodiment, no optical fiber is used in the entire loop and the system is implemented on a micro optical bench 110 as illustrated.

In one potential modification, the passband of the tunable filter 150 is configured to be polarization dependent, for ultra-high speed tuning In more detail, the passband of one polarization is shifted spectrally with respect to the other polarization. This allows the broadband signal light to enter at the first polarization, then the filter tunes by an increment corresponding to the shift between the polarization-dependent passbands and then the tunable signal passes through the tunable filter. By matching the spectral passband shift for the different polarizations, optical delay of the loop 602, and the tuning speed, higher speed tuning can obtained. On the downside, up/down wavelength tuning would probably not be possible.

Figure 5A:
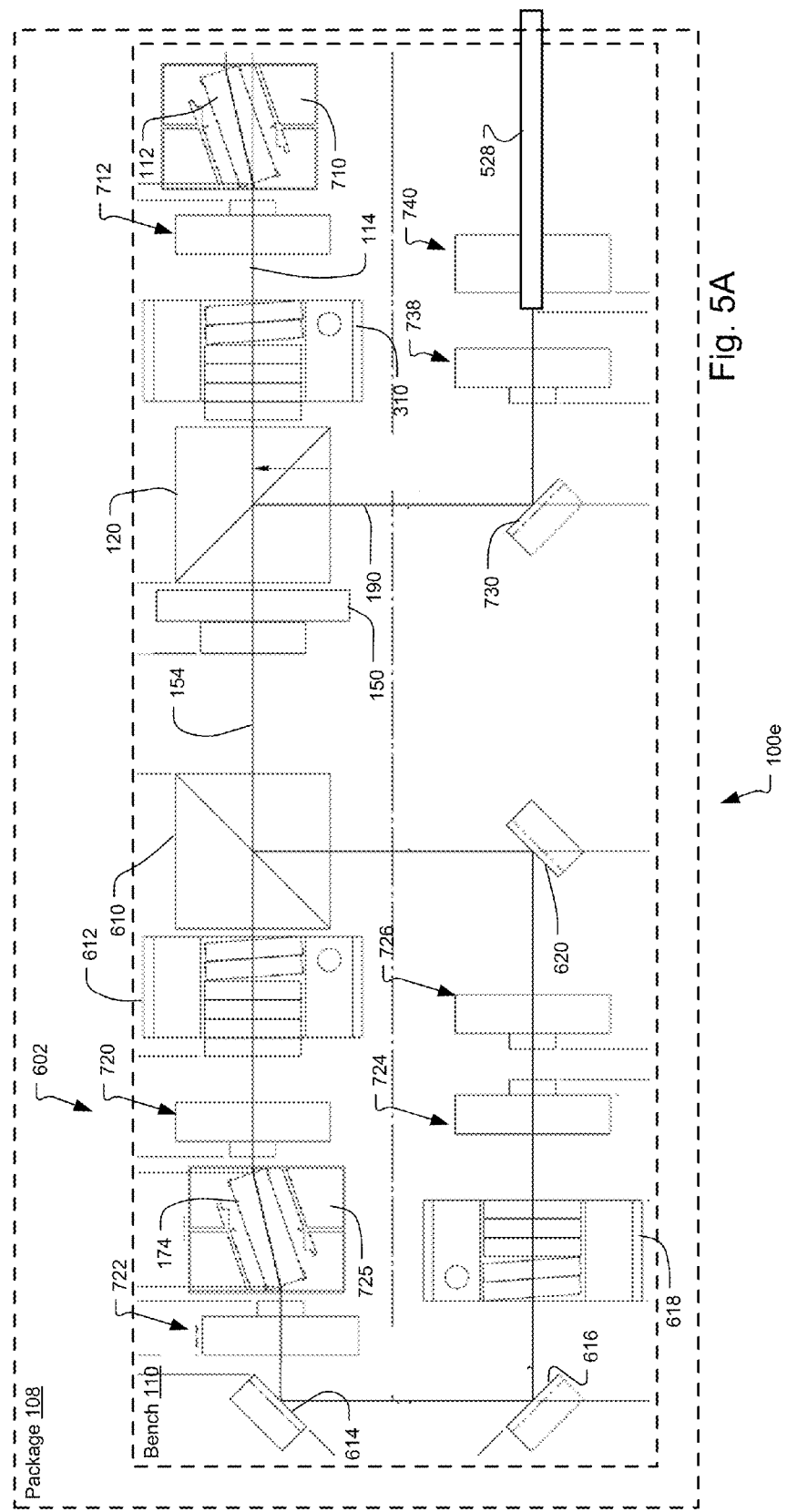
FIGS. 5A and B are scale top plan and perspective views of a swept optical source with a contra-directional self-tracking filter using polarization diversity with a loop amplification stage according to fifth embodiment.
Figure 5B:
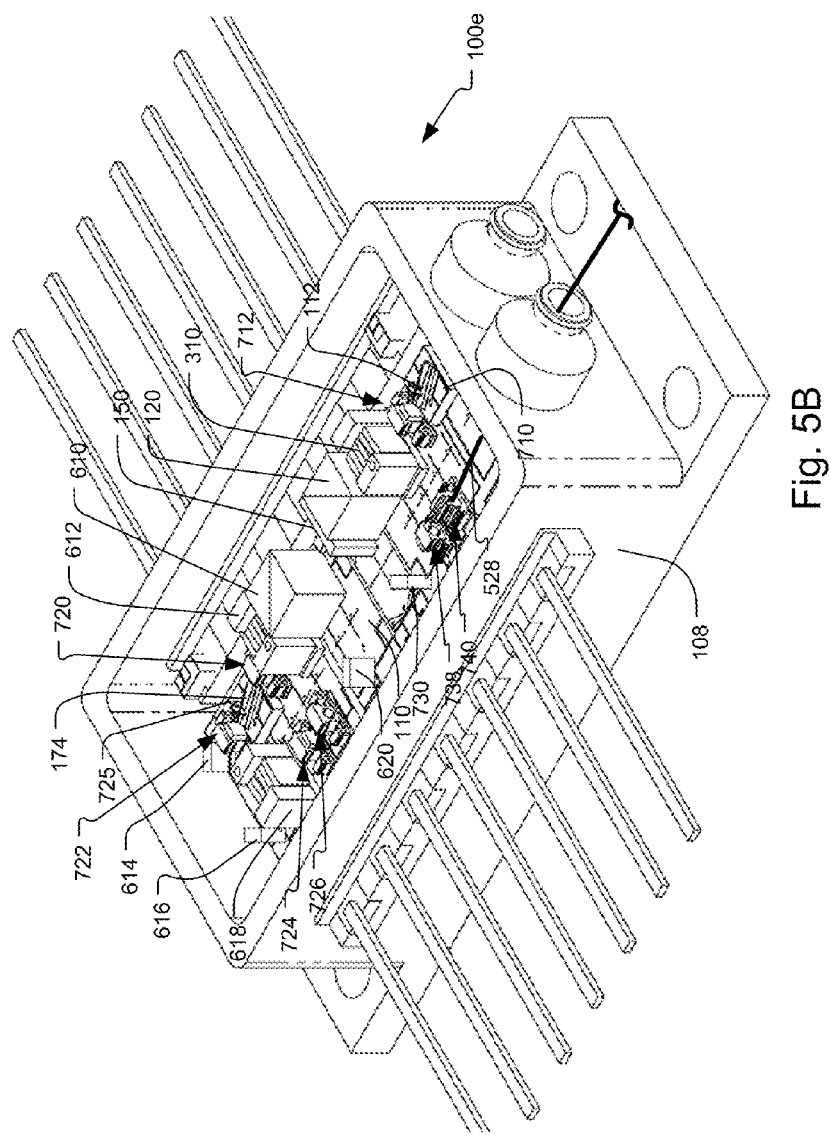

FIGS. 5A and 5B are scale views of a swept optical source 100e that is closely related to the FIG. 4 embodiment swept optical source 100d.

These figures are useful in showing an actual implementation of a swept source with contra-directional self tracking filter using polarization diversity and a loop amplification stage. They show the coupling optics, lenses, that are used to couple the optical signal in and out of the elements on the bench and the installation of the bench in a hermetic package 108. In FIG. 5B, the lid of the package 108 is removed to expose the optical elements.

The broadband source 112 generates the broadband signal 114. In the illustrated embodiment, the broadband source 112 is implemented as a semiconductor gain chip such as a SLED or SOA implemented as a SLED. In the illustrated example, the semiconductor gain chip is secured to a submount 710, which is bonded to the bench 110. The light exiting from the broadband source is collimated by a first lens component 712. As described previously, the lens components preferably comprise lens substrates that are bonded to mounting structures, which in turn are mounted to the bench.

The broadband signal then is transmitted through an isolator 310. This prevents back reflections into the broadband source 112 and thus lasing.

The horizontally polarized light from the broadband source 112 is transmitted through the PBS 120. The tunable filter 150, as described previously, then converts the broadband signal 114 into the narrowband tunable signal 154. The loop PBS 610 transmits the tunable signal 154 to a first loop isolator 612. A second lens component 720 couples the tunable optical signal 154 into the SOA 174 which is the optical amplifier in the loop 602. As described previously, the SOA 174 is preferably mounted onto the bench 110 by a submount 725.

Light exiting the SOA 174 is collimated by a third lens component 722 in the loop 602. Two subsequent fold mirrors 614 and 616 redirect the tunable optical signal. The tunable optical signal is then transmitted through a second loop isolator 618 and two lens components: a fourth lens component 724 and a fifth lens component 726. A fold mirror 620 returns the tunable optical signal to the loop PBS 610. As described previously, the second loop isolator 618 rotates the polarization of the tunable optical signal by 90° from horizontal to vertical polarization. As a result, the tunable optical signal received by the loop PBS 610 is reflected back to the tunable filter 150.

The tunable optical filter 150 again filters the tunable optical signal 154 applying its bandpass filter function. In passing through the tunable filter 150 this second time, light is propagating in the opposite direction and with orthogonal polarization to the first passage. The vertical polarization of the tunable optical signal from the tunable filter is reflected by the PBS 120 as the output signal 190.

The output signal path is folded to yield a compact design. In more detail, a fold mirror 730 reflects the output signal 190 to a direction parallel to the original broadband signal 114. A sixth lens component 738 focuses the light onto the entrance facet of an optical fiber 528. The fiber entrance facet is secured to the optical bench 110 via a fiber mounting structure 740.

Figure 6:
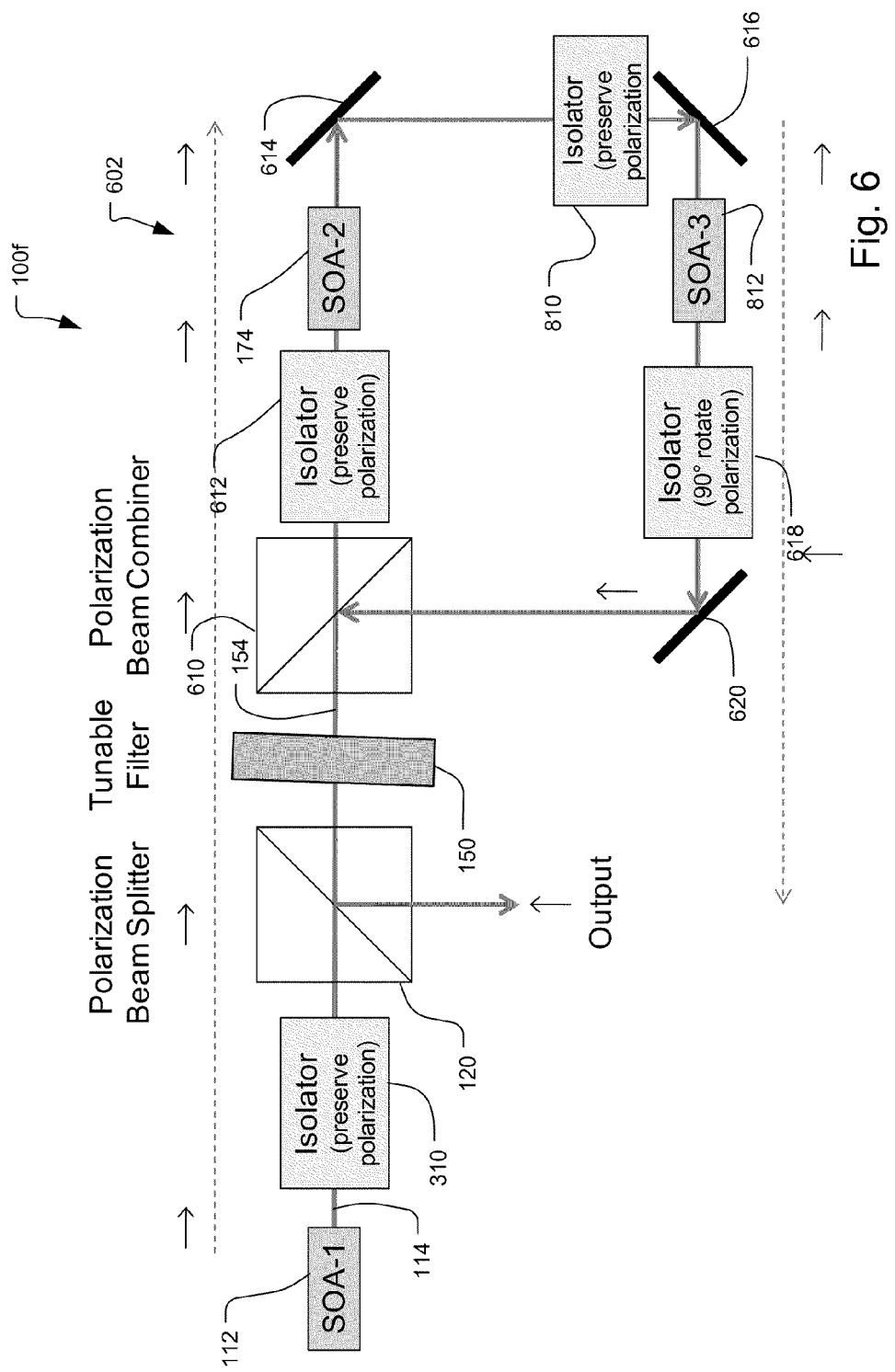
FIG. 6 is a block diagram of a swept optical source with a contra-directional self-tracking filter using polarization diversity and a loop amplification stage with dual amplifiers according to a sixth embodiment.

FIG. 6 shows a swept optical source 100f that is a variant of the FIG. 4 embodiment swept optical source 100d.

Generally, the description of the preceding swept optical source 100d applies to this embodiment 100f, with some exceptions.

The swept source 100f differs from the swept source of FIG. 4 in that it adds a second amplification stage in the loop 602. In more detail, a third isolator 810 is added to the loop 602. In the illustrated example, the third isolator 810 is located after the SOA 174 and between the fold mirrors 614 and 616. A second loop SOA 812 follows the third isolator 810. Light from the second loop SOA 812 is then transmitted through the second isolator 618 to the loop PBS 610.

The addition of the second amplification stage improves the power of the tunable optical signal that is generated by the swept source 100f enabling applications requiring even higher power optical signals.

Figure 7:
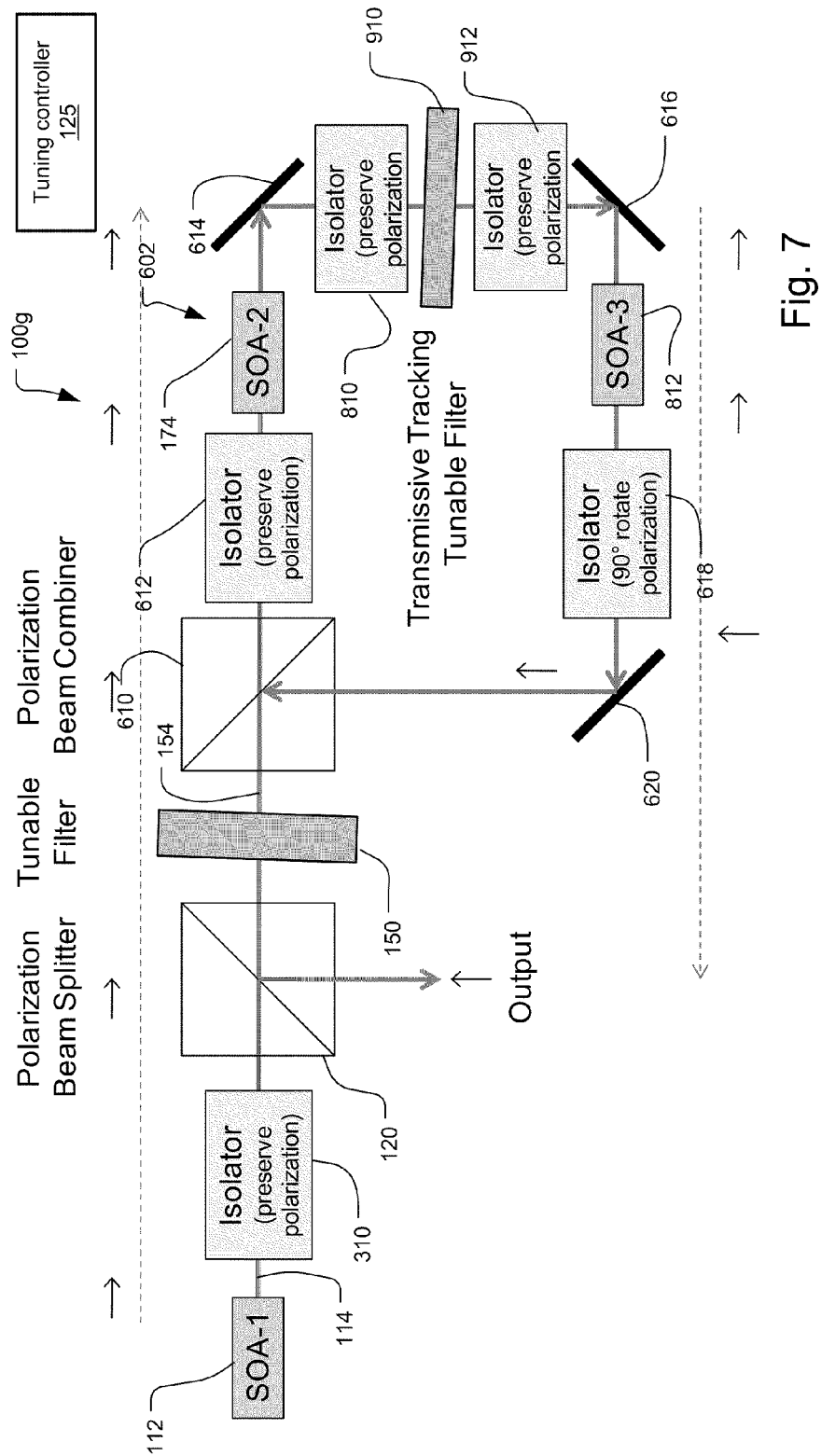
FIG. 7 is a block diagram of a swept optical source with a contra-directional self-tracking filter using polarization diversity and a loop amplification stage with an additional, tracking filter according to a seventh embodiment of the present invention.

FIG. 7 shows a swept optical source 100g that is a variant of the FIG. 6 embodiment swept optical source 100f.

Generally, the description of the preceding swept optical source 100f applies to this embodiment 100g, but this embodiment includes additional components for potentially higher performance and added capabilities.

In this embodiment, a transmissive tracking filter 910 is added between the first loop SOA 174 and the second loop SOA 812. In more detail, the tunable signal exiting from SOA 174 is reflected by fold mirror 614 to the third isolator 810. This prevents back reflections in to the SOA 174 from a subsequent tracking filter 910. This tracking filter 910 has a tunable passband similar to tunable filter 150. It is tuned by a tuning controller 125, along with the self tracking filter 150 so that its passband corresponds to the spectral position of the passband of the tunable filter 150. In short, during swept source operation, the transmissive tracking filter 910 is tuned synchronously with tunable filter 150 by the controller 125.

The tracking tunable filter 910 removes any noise outside of the signal band of the tunable signal 154. For example, it suppresses any ASE emissions from the SOA 174. The tunable signal from the transmissive tracking filter 910 is then transmitted through a fourth isolator 912. This prevents the subsequent SOA 812 from lasing.

Figure 8:
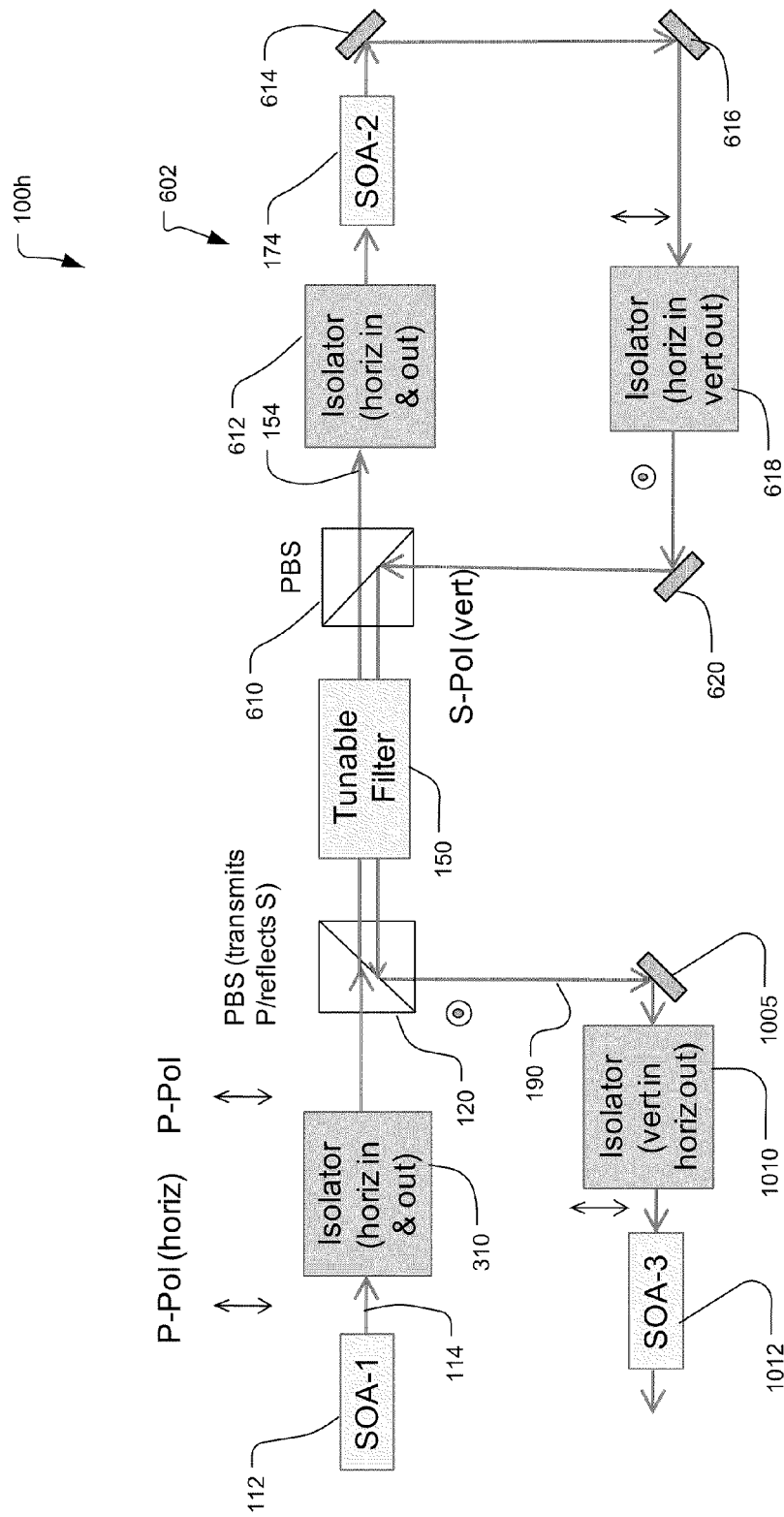
FIG. 8 is a block diagram of a swept optical source with a contra-directional self-tracking filter using polarization diversity and a loop amplification stage and an output amplification stage according to an eighth embodiment of the present invention.

FIG. 8 shows a swept optical source 100h that is a variant of the FIG. 4 embodiment swept optical source 100d.

Generally, the description of the preceding swept optical source 100d of FIG. 4 applies to this embodiment 100h, but this embodiment includes additional components for potentially higher performance and added capabilities.

The swept source 100h differs from the FIG. 4 embodiment in its addition of an output amplification stage. In more detail, the output tunable optical signal 190 from the PBS 120 is preferably redirected by a fold mirror 1005. The output tunable optical signal 190 is then transmitted to an output stage isolator 1010. From the isolator, the output signal 190 is coupled into an output optical amplifier 1012, preferably an SOA. However, in other implementations, other amplifier technologies are used such as rare-earth doped (e.g., Er-doped) optical fiber amplifiers.

In one particular implementation, the output stage isolator 1012 rotates the polarization of the output optical signal 190 from a vertical polarization to a horizontal polarization, which is the preferred polarization for many commercially available wideband SOA's.

In operation, once the signal is sufficiently amplified (typically −15 dBm), the final stage amplifier 1012 is driven to saturation. In this mode of operation, the gain outside the filter's passband is dramatically reduced, thus reducing the ASE contribution outside the filter's passband. It should be noted that the first amplifer SOA 174 is configured differently with respect to the output gain SOA 1012. The first SOA 174 is operated in a high gain configuration whereas the output SOA 1012 is operated in a high saturation regime to lower ASE output.

Figure 9:
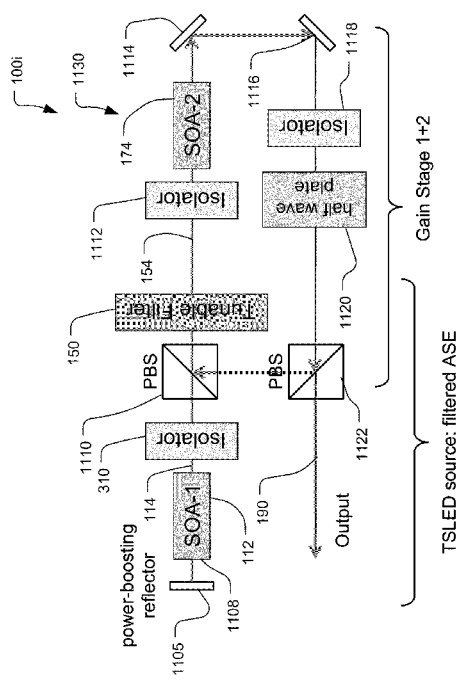
FIG. 9 is a block diagram of a swept optical source with a co-directional self-tracking filter using polarization diversity and a double-pass loop amplification stage according to a ninth embodiment of the present invention.

FIG. 9 shows another embodiment of the swept source 100i with a co-directional self tracking tunable filter using polarization diversity and a loop amplification stage, which has been constructed according to the principles of the invention.

The broadband source 112 is used to generate the broadband ASE signal 114. In the preferred embodiment, source 112 is a SLED or SOA implemented in a SLED configuration.

In one particular example, an SOA is used along with a power boosting reflector 1105, which is added opposite to the back facet 1108 of the SOA 112. The function of the power boosting reflector 1105 is to reflect back to the SOA the ASE light that is emitted out of the back facet 1108. Without this reflector, this ASE light is lost to the device and becomes stray light inside the device package. Such power boosting reflector serves to increase the output power of the broadband signal 114 that is generated by the chip. In many instances, however, it has the deleterious effect of decreasing the spectral band or spectral extent of the broadband signal 114. As such, the power boosting reflector 1105 component can be added to any of the SOA broadband sources in the other embodiments, when increased power in the broadband signal 112 is desired. On the other hand, when a broadband signal that includes a larger spectral band is required, the power boosting reflector 1108 is removed. Note that such double-pass SOA amplifier arrangement still operates to produce only amplified spontaneous emission and does not enter lasing regime, as the single reflector next to the amplifier does not form an optical resonator with periodic feedback that would be required to achieve lasing.

The broadband signal 114 is transmitted through an isolator 310 to block back reflections into the SOA 112. This prevents the formation of a laser cavity. The broadband signal 114 is then transmitted through a polarization beam splitter 1110. In a typical embodiment, the light emitted by the SOA 112 has a horizontal polarization, and the PBS 1110 is configured to transmit this horizontal polarization.

The broadband signal 114 from the PBS 1110 is transmitted in a first pass through the self tracking tunable filter 150. This converts the broadband signal 114 into the narrowband tunable signal 154. A subsequent isolator 1112 prevents back reflections from the tunable filter 150 from reaching a subsequent amplifier 174 in the loop 1130, which is implemented as a polarization independent SOA. This SOA 174 is polarization independent in that it preferably provides equal gain to optical signals along both polarizations, i.e., both parallel and vertical polarizations.

The light emitted by the SOA 174 is reflected by a first fold mirror 1114 and a second fold mirror 1116. The tunable signal 154 is then transmitted through a second loop isolator 1118 and then transmitted through a half wave plate 1120. The halfwave plate rotates the polarization of the tunable signal 154 by 90°. Thus, in one specific example, the tunable signal that was originally horizontally polarized, is now polarized in the vertical direction after transmission through the half wave plate 1120.

A second PBS 1122 is configured to reflect the tunable optical signal during its first transmission over the loop 1130. Thus in one embodiment, the PBS 1122 is configured to reflect light in the vertical polarization.

This vertically polarized light is returned to the first PBS 1110 and is thus reflected by it to pass through the tunable filter 150, in a second co-directional pass with orthogonal polarization, followed by the isolator 1112, the SOA 174 and the second loop isolator 1118 again. On the second transit through the half wave plate 1120, the tunable optical signal is now rotated to a horizontal polarization that is transmitted through the PBS 1122 to appear as the output signal 190.

The embodiment of FIG. 9 (100i) differs from other embodiments in that its loop 1130 supports the transmission of two polarization modes in the loop simultaneously. This configuration advantageously uses the tunable filter 150 in a co-directional self tracking configuration, while also in effect creating two gain stages out of the single SOA 174.

Figure 10:
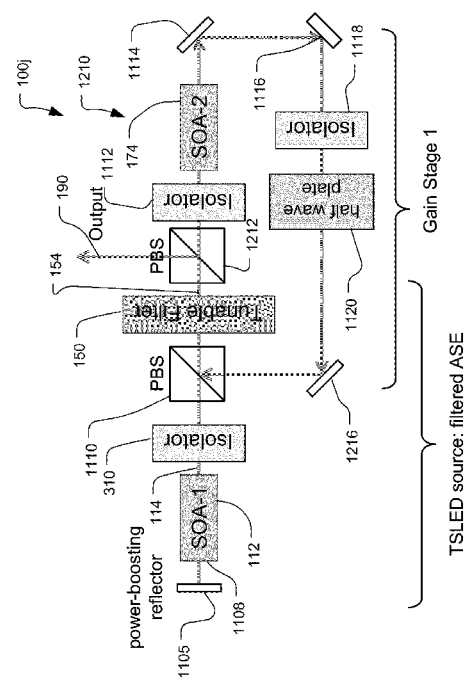
FIG. 10 is a block diagram of a swept optical source with a co-directional self-tracking filter using polarization diversity and a loop amplification stage according to a tenth embodiment of the present invention.

FIG. 10 shows another embodiment of the swept source 100j. In terms of configuration, it shares many similarities with the embodiment of the swept source 100i that is illustrated in FIG. 9. It differs in that the tunable optical signal only transits the loop a single time in this embodiment. This lowers the potential gain provided by the loop and removes the necessity for a polarization independent amplification in the loop.

In more detail, as discussed in the with respect to the previous embodiment, the broadband signal 114 is generated in the broadband source 112 and transmitted through the isolator 310 and then transmitted through a PBS 1110 to the tunable filter 150. After the tunable filter, the now narrowband tunable signal 154 is transmitted to a second PBS 1212. A subsequent first loop isolator 1112 prevents reflections into the subsequent SOA 174, which provides amplification in the loop 1210. The light output from the SOA 174 is reflected by two fold mirrors 1114 and 1116 and then is transmitted through a second loop isolator 1118. Again, this second loop isolator 1118 prevents back reflections into the SOA 174 to thereby prevent lasing.

A subsequent halfwave plate 1120 rotates the polarization of the tunable optical signal 154 in the loop 1210 by 90°. Thus, in one configuration, the tunable optical signal 154, which was originally in horizontal polarization, is now in a vertical polarization.

A subsequent fold mirror 1216 redirects the tunable optical signal to the first PBS 1110. The rotated polarization of the tunable optical signal is now reflected by the first PBS 1110 and again filtered by the tunable filter 150, in a second co-directional pass with orthogonal polarization, and then reflected by the second PBS 1212. Thus, the tunable optical signal 154 transits the loop 1210 on a single time before it appears as the output signal 190. Output signal 190 emerges right after passing through the tunable filter 150; this reduces the amount of undesired residual broadband spontaneous emission in the output signal.

Figure 11:
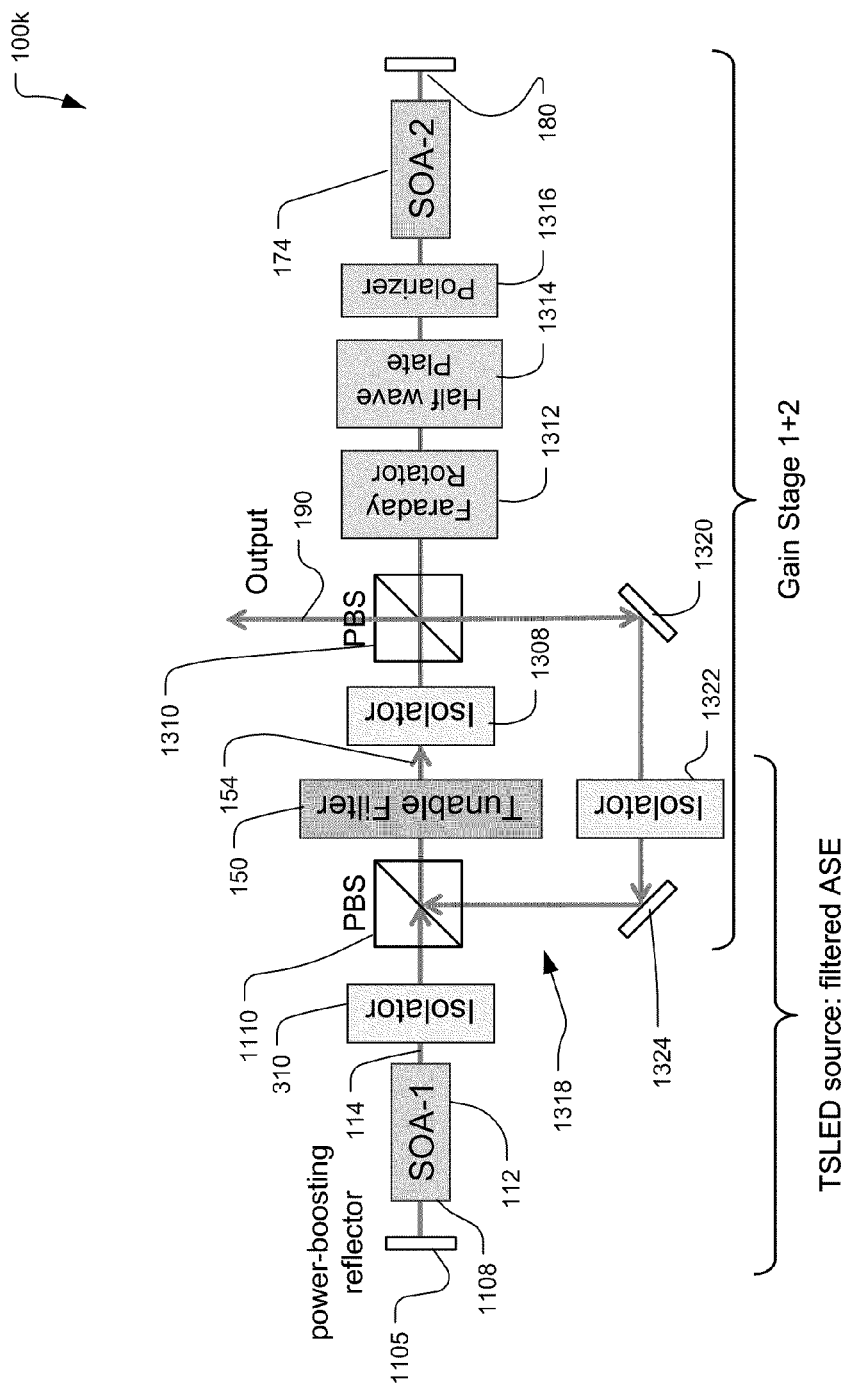
FIG. 11 is a block diagram of a swept optical source with a co-directional self-tracking filter in a filter loop using polarization diversity and a double pass reflective amplification stage according to an eleventh embodiment of the present invention.

FIG. 11 shows another embodiment of the swept source 100k that uses an SOA in a double pass reflective configuration and also incorporates a loop surrounding the co-directional self tracking tunable filter 150.

In more detail, the broadband signal is generated by the broadband source 112 and is transmitted through an isolator 310 to a PBS 1110. PBS 110 is configured to pass the polarization of the SOA 112, typically the horizontal polarization. The broadband signal 114 is then transmitted in a first pass through the tunable filter 150 to generate the tunable optical signal 154. A subsequent isolator 1308 prevents back reflections. Then, the tunable optical signal 154 is transmitted through a second PBS 1310.

The tunable optical signal then enters a double pass gain stage. Specifically, a Faraday rotator 1312 rotates the polarization by 45°, then a subsequent halfwave plate 1314 rotates the polarization of the tunable optical signal by 45° in the opposite direction to produce, for example, horizontal polarization convenient for SOA 174. The resulting polarization is transmitted through a polarizer 1316 to be amplified in the amplifier or SOA 174. A reflector 180 at or adjacent to the output facet of the SOA 174 reflects the optical signal to pass through the SOA 174 again for further amplification. Polarization dependent, i.e. single polarization, SOA is preferably used in this reflective amplifier configuration. Since the polarization of the optical signal was not rotated in the SOA, it is again transmitted through the polarizer 1316. The subsequent halfwave plate 1314 rotates the polarization reciprocally. And the polarization is again rotated non-reciprocally by 45° in the Faraday rotator 1312 to polarization orthogonal to that when it entered the gain stage. Due to the non-reciprocal nature of the Faraday rotator 1312, the returning tunable optical signal is now orthogonally polarized and is reflected by the second PBS 1310 and enters the loop 1318.

A first fold mirror 1320 in the loop 1318 reflects the tunable optical signal to pass through an isolator 1322 and then be reflected by a second fold mirror 1324. This returns the tunable optical signal to the first PBS 1110. Since the polarization of the tunable optical signal has now been rotated relative to the original polarization of the broadband signal 114, to a vertical polarization in one example, the tunable optical signal 154 is reflected by the PBS 1110 to pass through the tunable filter 150 a second time, co-directional and orthogonally polarized to the first pass, and then through isolator 1308. Now, with the rotated polarization, the tunable optical signal 154 is reflected by the second PBS 1310 to appear as the output signal 190.

Figure 12:
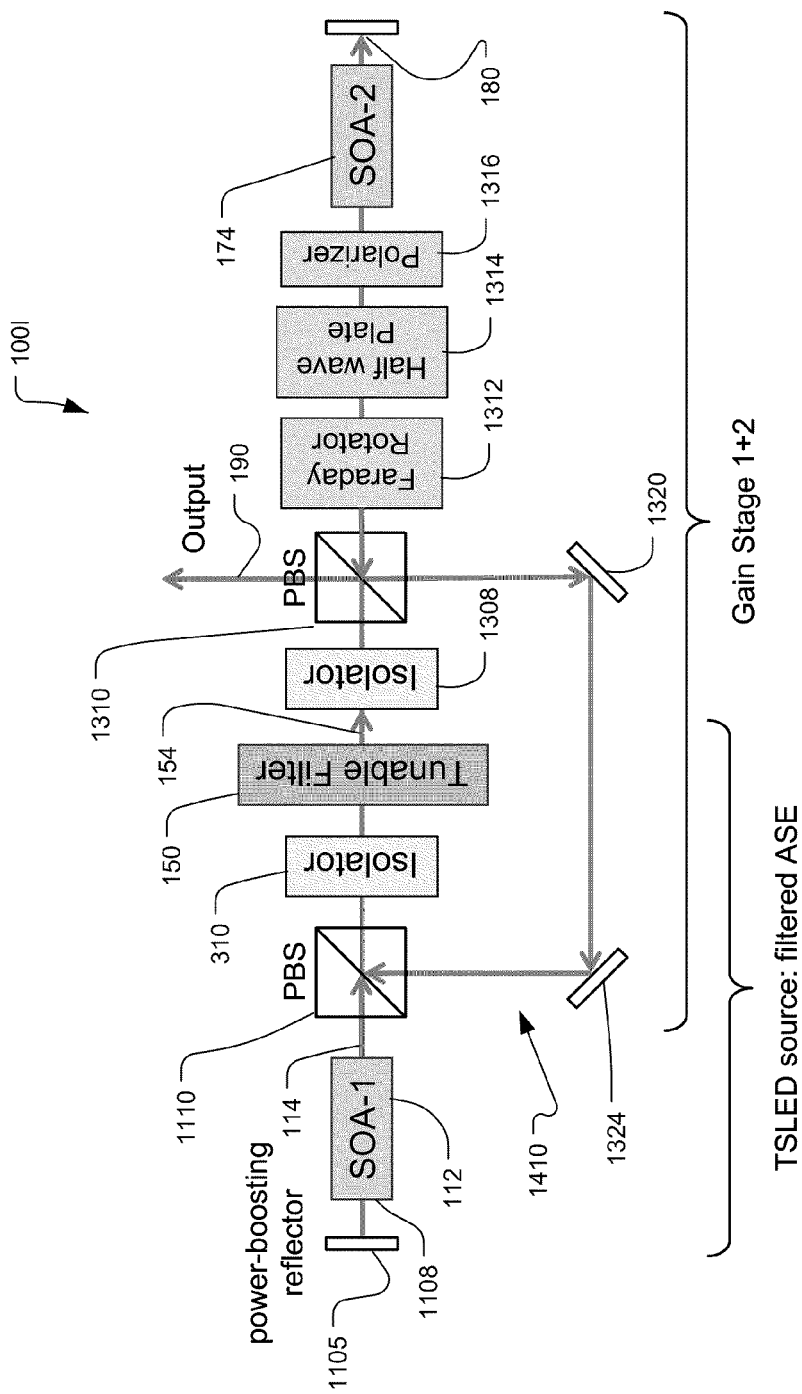
FIG. 12 is a block diagram of a swept optical source with a co-directional self-tracking filter in a filter loop using polarization diversity and a double pass reflective amplification stage according to a twelfth embodiment of the present invention.

FIG. 12 shows a swept source 1001 that is similar to the configuration (100k) illustrated in FIG. 11. This specific configuration makes more efficient use of the isolators, being able to achieve similar functionality with one less isolator than the FIG. 11 embodiment.

Here, the broadband signal 114 produced by the broadband source 112 is coupled directly into the PBS 1110 without an intervening isolator. Instead the isolator 310 is moved inside the loop 1410. That is, the broadband signal 114 is transmitted through the PBS 1110 to the first isolator 310. Then, the broadband signal 114 is coupled into the tunable filter 150 to produce, in a first pass, the subsequent narrowband tunable signal 154. A second isolator 1308 is also located in the loop 1410. The tunable signal 154 is transmitted through a second PBS 1310. The tunable signal is then coupled into a double pass reflective gain stage similar to that described with respect to FIG. 13 comprising a Faraday rotator 1312, a halfwave plate 1314, a polarizer 1316, and the SOA 174 in a double pass reflective configuration.

The amplified tunable signal 154 is received back from the double pass gain stage in orthogonal polarization due to the non-reciprocal operation of the Faraday rotator 1312. As a result, the tunable signal is reflected into the loop 1410 by the second PBS 1310 to a pair of fold mirrors 1320 and 1324. This returns the tunable signal to the first PBS 1110, where it is reflected. It passes through the isolator 310 and the tunable filter 150 a second time, co-directionally and with orthogonal polarization to the first pass. After transmission through the second isolator 1308, the tunable signal 154, with its now orthogonally rotated polarization, is reflected by the second PBS 1310 to appear as the output signal 190.

Figure 13:
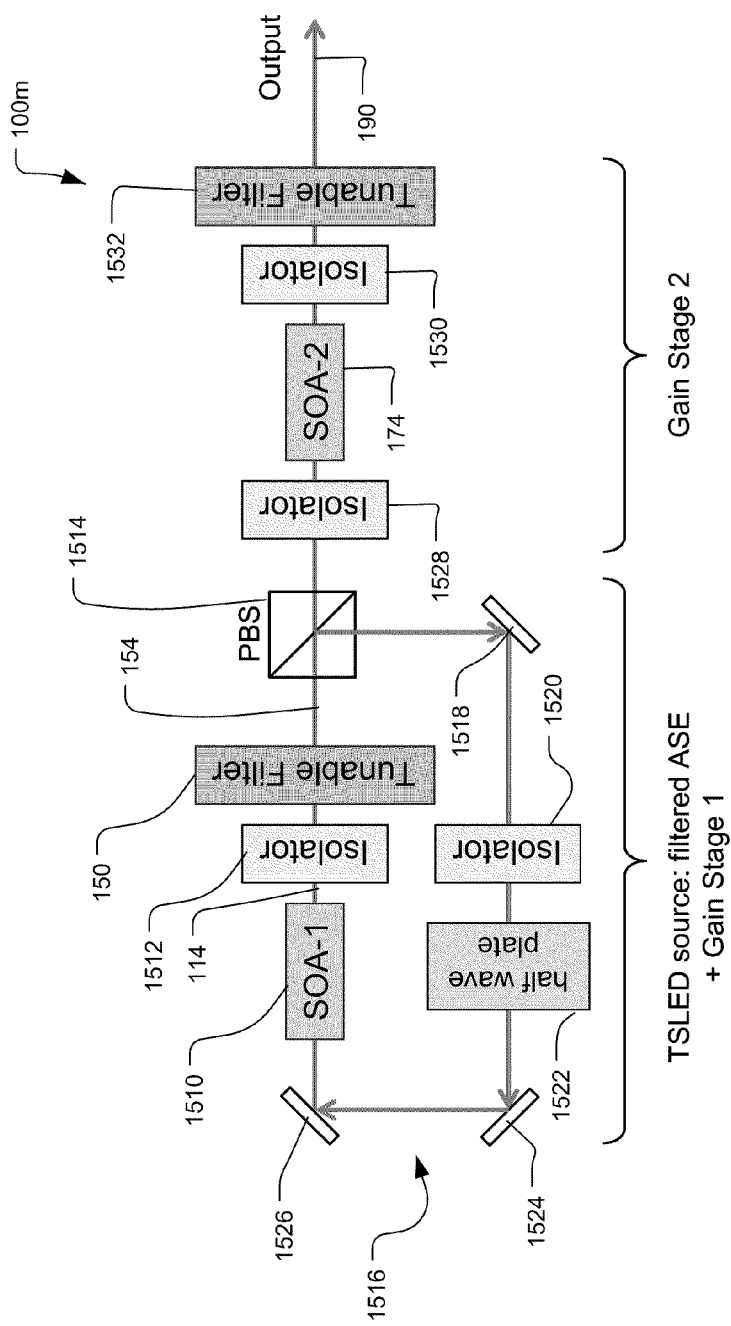
FIG. 13 is a block diagram of a swept optical source with a co-directional self-tracking filter in a double pass amplifier—filter loop using polarization diversity and an additional amplification stage with a tracking filter according to a thirteenth embodiment of the present invention.

FIG. 13 shows another embodiment 100m that uses the combination of a double pass loop configuration with a co-directional self-tracking filter, this followed by a second gain stage.

In more detail, a broadband source 1510 is located within a double pass loop 1516. In the preferred embodiment, the broadband source 1510 is a semiconductor gain chip such as a SOA that has anti-reflection coated front and back facets. Moreover, the SOA 1510 is selected to be polarization isotropic or polarization independent. As a result, it amplifies light at either polarization, preferably equally.

The SOA 1510 generates ASE light that serves as the broadband seed 114. The broadband light is transmitted through a first isolator 1512 to prevent lasing. Then, the narrowband tunable signal 154 is generated by the transmission of the broadband signal through the tunable filter 150. This narrowband signal 154 is then reflected by the PBS 1514, which selects a single polarization for re-amplification inside the loop. A first fold mirror 1518 reflects the tunable signal to pass through a second isolator 1520 and a halfwave plate 1522. The narrowband signal, now in orthogonal polarization, is then returned to the back facet of the SOA 1510 using two more fold mirrors 1524 and 1526.

The tunable optical signal injected through the rear facet of the SOA 1510 is amplified by the SOA. It passes through the isolator 1512 and the tunable filter 150, a second time co-directionally and with orthogonal polarization to the first pass. Due to the operation of the halfwave plate 1522, the amplified tunable signal is now orthogonally polarized and is now transmitted through the PBS 1514. Then, tunable signal 154 passes through a third isolator 1528 and preferably undergoes further amplification in an amplifier or SOA 174. A final isolator 1530 is preferably used to prevent back reflections and lasing by the SOA 174.

In one embodiment, a final tracking tunable filter 1532 is provided. This tracking filter is useful to attenuate ASE emissions outside of the signal band of the tunable signal 154. The tracking filter 1532 is tuned so that it is passband coincides with that of the tunable filter 150. In high-speed operation, it is tuned synchronously with the tunable filter 150.

This embodiment has advantages insofar as it optimally uses the first SOA 1510. It operates both as an ASE seed and a first amplification stage.

FIG. 14 shows another embodiment 100p that utilizes two loops 1626 and 1640 to support the co-directional self tracking filter 150.

In more detail, a broadband source 1610 functions as an ASE seed. Preferably, the broadband source 1610 is an SOA that has anti-reflection coated on its front and rear facets. The ASE light is transmitted out of the rear facet of the SOA 1610. A first polarization beam splitter 1612 selects to transmit a single polarization of the ASE light produced by the SOA 1610. The broadband signal 114 is then transmitted through a second PBS 1614. A subsequent isolator 1616 prevents back reflections and otherwise transmits the broadband signal 114 to the self tracking tunable filter 150.

The operation of the filter function on the broadband signal 114 produces the narrowband tunable signal 154. A subsequent third PBS 1620 is configured to reflect the light at the polarization of the broadband signal 114 and the tunable signal 154 on its first pass through the tunable filter 150.

The PBS 1620 diverts this first-pass light to the first loop 1626. Two fold mirrors 1630 and 1634 return the tunable signal to the second PBS 1614. A halfwave plate in the first loop 1626 rotates the polarization by 90°. As a result, on returning to the second PBS 1614, the tunable signal 154 is reflected to again pass through the isolator 1616 and tunable filter 150, co-directionally and with orthogonal polarization to the first pass. With its rotated polarization, the tunable signal 154, after the second pass, is transmitted through the third PBS 1620 to the second loop 1640. Three fold mirror's 1642, 1644, and 1648 form the second loop 1640 and return the tunable signal to the first PBS 1612. And isolator 1646 is preferably placed in the second loop 1642 prevent back reflections.

On returning from the second loop 1640, the tunable signal is reflected by the first PBS 1612 to pass through the SOA 1610, again, now in the opposite direction and with orthogonal polarization. This allows the SOA 1610 to function as an amplifier for the tunable signal 154. The output signal 190 is then taken from an isolator 1650.

FIG. 15 shows another embodiment 100o which is related to the embodiment (100n) described with respect to FIG. 14. It is a two loop configuration. It adds two stages of amplification, however.

In more detail, as described with respect to FIG. 14, the SOA 1610 functions as the ASE seed. The broadband light 114 is transmitted through the first PBS 1612 and the second PBS 1614. The broadband signal is then transmitted through the first isolator and the tunable filter 150 to produce the narrow band tunable signal 154. A subsequent isolator 1710 is added along with an amplifier or SOA 1711. Preferably this first SOA, amplification stage, is polarization isotropic. As a result, it amplifies light along either polarization. The third PBS 1620 reflects the amplified tunable signal to an isolator 1712 that prevents back recollections into the SOA 1711. The two fold mirrors 1630 and 1634 form the loop 1708 that returns the amplified tunable signal to the second PBS 1614.

Preferably the first loop 1708 further includes a polarizer 1714, a halfwave plate 1632 and a second SOA amplification stage 1716. The second SOA application stage 1716 can be polarization anisotropic. That is, it amplifies light predominantly only along a single polarization, such as vertical. One can also reverse the order of the half wave plate 1632 and the SOA 1716, with the optical beam in the loop 1708 first passing through the SOA 1716 and then the polarization rotating halfwave plate 1632. In this case the SOA 1716 can operate with horizontal gain polarization. As described in the previous embodiment, the halfwave plate 1632 in the first loop 1708 rotates the polarization so that the light returning to the second PBS 1614 is reflected to pass again through the isolator 1616, tunable filter 150, isolator 1710, and first amplification stage SOA 1711.

The rotated polarization of the now amplified tunable signal 154 means that the amplified tunable signal is transmitted through the third PBS 1620 to the second loop 1640. As described in the previous embodiment, the second loop 1640 returns the tunable signal to the first PBS 1612. Now, the tunable signal 154 is transmitted again through the seed SOA 1610. A final isolator 1650 on the output path yields the output signal 190 while preventing lasing in the seed SOA 1610.

In total, the embodiment of FIG. 15 provides four stages of amplification. This is achieved with only three optical amplifiers.

In other embodiments, either the first SOA amplification stage 1711 and/or the second SOA amplification stage 1716 are eliminated if the full four stage amplification is not required. With such modifications, some of the additional isolators are eliminated.

Figure 16:
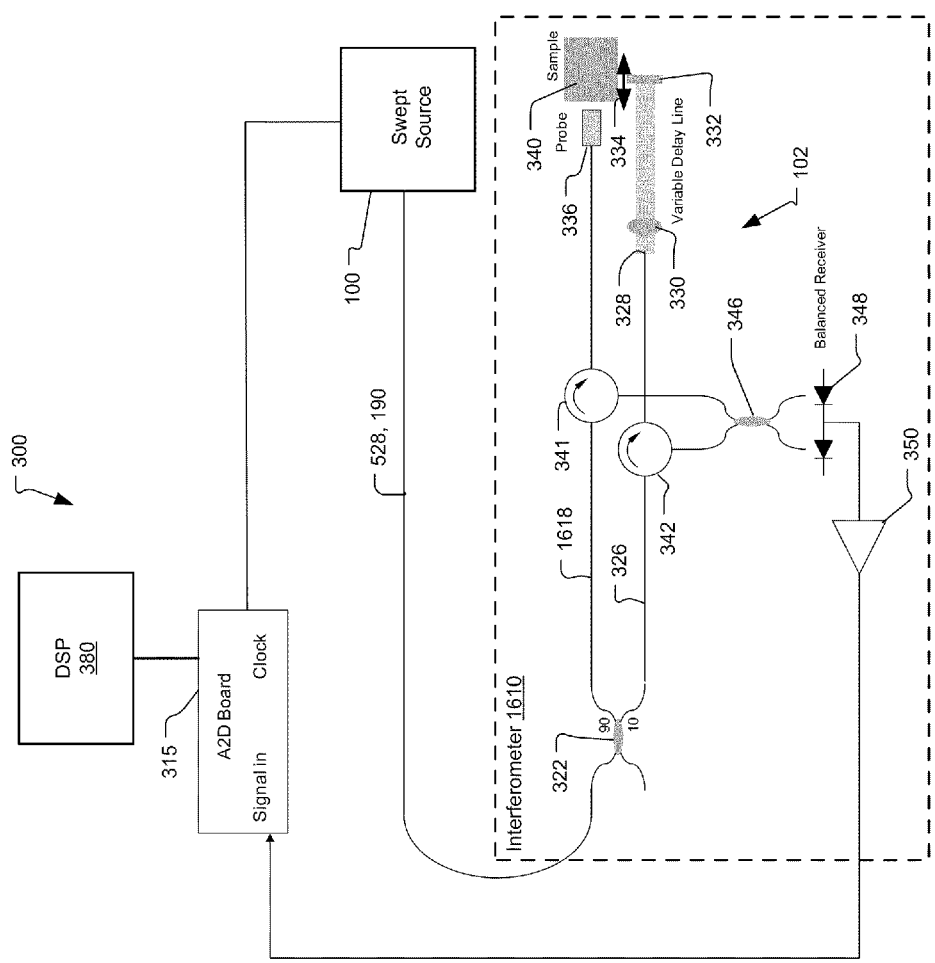
FIG. 16 is a block diagram of an OCT system using the inventive swept sources.

FIG. 16 shows an optical coherence analysis system 300 using the swept sources 100 described above.

In more detail, a Michelson interferometer 1610 is used to analyze the optical signals from the sample 340. The tunable output optical signal 190 from the swept source module 100 is output on fiber 528 to a, for example, 90/10 optical coupler 322. The tunable signal 190 is divided by the coupler 322 between a reference arm 326 and a sample arm 1618 of the system. The optical fiber of the reference arm 326 terminates at the fiber endface 328. The light exiting from the reference arm fiber endface 328 is collimated by a lens 330 and then reflected by a mirror 332 to return back.

The external mirror 332 has an adjustable fiber to mirror distance (see arrow 334). This distance determines the depth range being imaged, i.e. the position in the sample 340 of the zero path length difference between the reference arm 326 and the sample arm 1618. The distance is adjusted for different sampling probes and/or imaged samples. Light returning from the reference mirror 332 is returned to a reference arm circulator 342 and directed to a 50/50 fiber coupler 346.

The fiber on the sample arm 1618 terminates at the sample arm probe 336. The exiting light is focused by the probe 336 onto the sample 340. Light returning from the sample 340 is returned to a sample arm circulator 341 and directed to the 50/50 fiber coupler 346. The reference arm signal and the sample arm signal are combined in the fiber coupler 346. The combined/interference signal is detected by a balanced receiver, comprising two detectors 348, at each of the outputs of the fiber coupler 346. The electronic interference signal from the balanced receiver 348 is amplified by amplifier 350.

An analog to digital converter system 315 is used to sample the interference signal output from the amplifier 350. Frequency clock and sweep trigger signals derived from the swept source are used by the A2D board 315 to synchronize system data acquisition with the frequency tuning of the swept source.

Once a complete data set has been collected from the sample 340 by spatially raster scanning the focused probe beam point over the sample, in a Cartesian geometry x-y fashion or a cylindrical geometry theta-z fashion, and the spectral response at each one of these points is generated from the frequency tuning of the swept source 100. The digital signal processor 380 performs a Fourier transform on the data in order to reconstruct the image and perform a 2D or 3D tomographic reconstruction of the sample 340. This information generated by the digital signal processor 380 can then be displayed on a video monitor.

Figure 17:
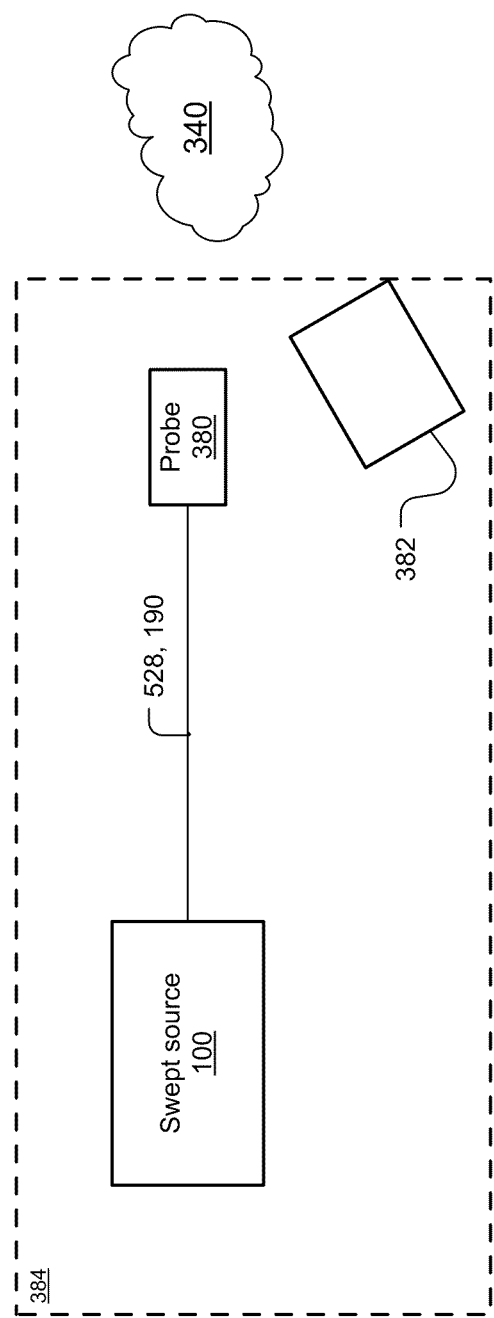
FIG. 17 is a block diagram of a spectroscopy system using the inventive swept sources.

FIG. 17 shows another application, for example spectroscopic application, for the swept sources 100. In this embodiment, the swept source 100 generates the narrowband tunable output signal 190. This is transmitted on an optical fiber 528 to a probe 380. A sample 340 is illuminated by the tunable signal 190 from the probe 380. A detector 382 detects the diffuse or specular reflectance, typically, from the sample 340. By tuning the swept source 100 over the wavelength scan band, the time-resolved response of the detector 382 corresponds to the spectral response of the sample 340. In this way, the swept source is used in a spectroscopy analysis system 384.

One advantage of the swept source 100 is that it has a widely controllable level of coherence, since it is not a laser. This is important for controlling and limiting speckle, which can undermine the accuracy of the spectral analysis. Tunable signals with a wider dynamic linewidth, such as possible with the filtered ASE swept sources, will have lower measured speckle levels than the typically very narrow linewidth swept laser sources.

While this invention has been particularly shown and described with references to preferred embodiments thereof, it will be understood by those skilled in the art that various changes in form and details may be made therein without departing from the scope of the invention encompassed by the appended claims.

What is claimed is:

1. A swept optical source, comprising:
   a tunable filter for spectrally filtering light from a broadband source to generate a tunable optical signal that is spectrally tuned over a scanband;
   a semiconductor optical amplifier for amplifying the tunable optical signal with the amplified tunable optical signal being again filtered by the tunable filter before exiting the swept optical source without again being amplified by the semiconductor optical amplifier to prevent lasing and formation of a resonator; and
   a tuning controller that drives the tunable filter to tune over the scanband at speeds greater than 10 kiloHertz.

2. A swept source as claimed in claim 1, wherein the broadband source generates light over the scanband.

3. A swept source as claimed in claim 1, wherein the broadband source comprises an amplified spontaneous emission source that generates light over the scanband.

4. A swept source as claimed in claim 1, wherein the tunable filter is a Fabry Perot tunable filter.

5. A swept source as claimed in claim 1, wherein the tunable filter is a micro electro mechanical system Fabry Perot tunable filter.

6. A swept source as claimed in claim 1, wherein in a passband of the tunable optical filter is less than 20 GigaHertz (FWHM).

7. A swept source as claimed in claim 1, wherein in a passband of the tunable optical filter is less than 5 GigaHertz (FWHM).

8. A swept source as claimed in claim 1, further comprising a tuning controller that drives the tunable filter to tune over the scanband at speeds greater than 100 kiloHertz.

9. A swept source as claimed in claim 1, further comprising a reflector for reflecting the tunable optical signal to pass through the optical amplifier a second time and back to the tunable filter.

10. A swept source as claimed in claim 1, further comprising a loop including the optical amplifier for directing the tunable optical signal back to the tunable filter.

11. A swept source as claimed in claim 1, further comprising a polarization rotation system for rotating a polarization of the tunable optical signal between being filtered by the tunable filter.

12. A swept source as claimed in claim 11, wherein the polarization rotation system includes a non-reciprocal polarization rotation element.

13. A swept source as claimed in claim 11, wherein the polarization rotation system includes a halfwave plate.

14. A swept source as claimed in claim 1, wherein the filtering by the tunable filter of the tunable optical signal is co-directional with the filtering of the amplified tunable optical signal by the tunable filter.

15. A swept source as claimed in claim 1, wherein the filtering by the tunable filter of the tunable optical signal is contra-directional with the filtering of the amplified tunable optical signal by the tunable filter.

16. A method for generating a tunable optical signal, comprising:
   spectrally filtering light to generate a tunable optical signal with a tunable filter that is spectrally tuned over a scanband;
   amplifying the tunable optical signal to generate an amplified tunable optical signal;
   spectrally filtering the amplified tunable optical signal with the same tunable filter;
   transmitting the amplified tunable optical signal as an output and preventing further amplification to prevent lasing and formation of a resonator; and
   tuning the tunable filter over the scanband at a speeds greater than 10 kiloHertz.

17. A method as claimed in claim 16, further comprising generating the light with a broadband source that generates light over the scanband.

18. A method as claimed in claim 16, wherein the tunable filter is a Fabry Perot tunable filter.

19. A method as claimed in claim 16, further comprising tuning the tunable filter over the scanband at a speeds greater than 100 kiloHertz.

20. A method as claimed in claim 16, further comprising directing the tunable optical signal back to the tunable filter using a loop.

21. A method as claimed in claim 16, further comprising directing the tunable optical signal back to the tunable filter using a reflector.

22. A tunable amplifier, comprising:
   a tunable filter for spectrally filtering light to generate a tunable optical signal that is spectrally tunable over a spectral band;
   a semiconductor optical amplifier for amplifying the tunable optical signal with the amplified tunable optical signal being filtered by the tunable filter with no more than two passes through the optical amplifier to prevent lasing and formation of a resonator; and
   a tuning controller that drives the tunable filter to tune over the scanband at speeds greater than 10 kiloHertz.

23. A swept optical source, comprising:
   a tunable filter for spectrally filtering light from a broadband source to generate a tunable optical signal that is spectrally tuned over a scanband;

a semiconductor optical amplifier for amplifying the tunable optical signal in a first pass;
a reflector for reflecting the tunable optical signal to pass through the optical amplifier in a only second pass to prevent lasing and formation of a resonator; and
a tuning controller that drives the tunable filter to tune over the scanband at speeds greater than 10 kiloHertz.

* * * * *